US010770493B2

(12) United States Patent
Gotou et al.

(10) Patent No.: US 10,770,493 B2
(45) Date of Patent: Sep. 8, 2020

(54) SOLID-STATE IMAGING APPARATUS WITH HIGH HANDLING RELIABILITY AND METHOD FOR MANUFACTURING SOLID-STATE IMAGING APPARATUS

(71) Applicant: SONY CORPORATION, Tokyo (JP)

(72) Inventors: Takayuki Gotou, Kumamoto (JP); Kiyotaka Hori, Kumamoto (JP)

(73) Assignee: SONY CORPORATION, Tokyo (JP)

( * ) Notice: Subject to any disclaimer, the term of this patent is extended or adjusted under 35 U.S.C. 154(b) by 44 days.

(21) Appl. No.: 16/081,712

(22) PCT Filed: Feb. 14, 2017

(86) PCT No.: PCT/JP2017/005243
§ 371 (c)(1),
(2) Date: Aug. 31, 2018

(87) PCT Pub. No.: WO2017/159174
PCT Pub. Date: Sep. 21, 2017

(65) Prior Publication Data
US 2019/0019826 A1    Jan. 17, 2019

(30) Foreign Application Priority Data

Mar. 15, 2016  (JP) ................................ 2016-051043

(51) Int. Cl.
*H01L 27/146* (2006.01)
*H01L 27/14* (2006.01)
*H01L 23/28* (2006.01)

(52) U.S. Cl.
CPC ........ *H01L 27/14618* (2013.01); *H01L 23/28* (2013.01); *H01L 27/14* (2013.01);
(Continued)

(58) Field of Classification Search
CPC .......................... H01L 27/14618; H01L 23/28
(Continued)

(56) References Cited

U.S. PATENT DOCUMENTS 5,778,523 A * 7/1998 Sylvester ............ H01L 23/3735
174/260
5,838,063 A * 11/1998 Sylvester ................ H01L 23/10
257/704

(Continued)

FOREIGN PATENT DOCUMENTS

JP    2006-173220 A    6/2006
JP    2008-124160 A    5/2008

(Continued)

OTHER PUBLICATIONS

International Search Report and Written Opinion of PCT Application No. PCT/JP2017/005243, dated Mar. 28, 2017, 13 pages of ISRWO.

*Primary Examiner* — Jami Valentine Miller
(74) *Attorney, Agent, or Firm* — Chip Law Group

(57) ABSTRACT

Provided are a solid-state imaging apparatus capable of having reduction in height and size while easily controlling warp with high handling reliability when the solid-state imaging apparatus is mounted on another substrate, and a method for manufacturing the solid-state imaging apparatus. The solid-state imaging apparatus includes a substrate having a recess on a surface thereof, an imaging chip disposed and fixed on an inner bottom surface of the recess, and a filler filled and solidified in the whole of a gap between a side surface of the imaging chip and an inner surface of the recess. A groove having a substantially constant width is formed between the side surface of the imaging chip and the inner surface of the recess. An expansion portion having width equal to or larger than the constant width is in a portion of the groove.

10 Claims, 12 Drawing Sheets

(52) U.S. Cl.
CPC .. *H01L 27/14623* (2013.01); *H01L 27/14636* (2013.01); *H01L 27/14683* (2013.01); *H01L 2224/19* (2013.01); *H01L 2224/24227* (2013.01); *H01L 2224/32225* (2013.01); *H01L 2224/73267* (2013.01); *H01L 2224/83191* (2013.01); *H01L 2224/92244* (2013.01); *H01L 2224/97* (2013.01); *H01L 2924/15153* (2013.01)

(58) Field of Classification Search
USPC ........................................................ 257/433
See application file for complete search history.

(56) References Cited

U.S. PATENT DOCUMENTS

| | | | | |
|---|---|---|---|---|
| 2004/0235406 A1* | 11/2004 | Duescher | ............. | B24D 11/001 451/527 |
| 2010/0181636 A1 | 7/2010 | Takayama et al. | | |
| 2011/0104856 A1* | 5/2011 | Lin | ...................... | H05K 1/0204 438/118 |

FOREIGN PATENT DOCUMENTS

| | | |
|---|---|---|
| JP | 2008-219854 A | 9/2008 |
| JP | 2010-021471 A | 1/2010 |
| JP | 2010-161140 A | 7/2010 |
| JP | 2010-192866 A | 9/2010 |
| JP | 2011-060920 A | 3/2011 |
| JP | 2012-248694 A | 12/2012 |

\* cited by examiner

SOLID-STATE IMAGING APPARATUS WITH HIGH HANDLING RELIABILITY AND METHOD FOR MANUFACTURING SOLID-STATE IMAGING APPARATUS

CROSS REFERENCE TO RELATED APPLICATIONS

This application is a U.S. National Phase of International Patent Application No. PCT/JP2017/005243 filed on Feb. 14, 2017, which claims priority benefit of Japanese Patent Application No. JP 2016-051043 filed in the Japan Patent Office on Mar. 15, 2016. Each of the above-referenced applications is hereby incorporated herein by reference in its entirety.

TECHNICAL FIELD

The present technology relates to a solid-state imaging apparatus and a method for manufacturing the solid-state imaging apparatus.

BACKGROUND ART

Conventionally, a solid-state imaging apparatus having a hollow structure (cavity) in a package structure thereof has been generally used. In such a solid-state imaging apparatus having a cavity, moisture may infiltrate the apparatus from a bonding portion between sealing glass and the package. When moisture enters the cavity, fogging may occur inside the cavity to degrade image quality, or a part disposed in the cavity, such as an image sensor, may be adversely affected by moisture. In addition, due to the hollow structure, the thickness of the package structure increases, and the volume of the entire package also increases.

For this reason, various attempts have been made in order to achieve reduction in height and size of the solid-state imaging apparatus by making the solid-state imaging apparatus cavity-less (for example, Patent Documents 1, 2, and the like).

Patent Document 1 discloses an image sensor chip size package obtained by forming a circuit element constituting an image sensor on an image sensor forming surface on a surface of a semiconductor substrate, connecting a prescribed wiring layer in a multilayer wiring portion formed thereon to a through electrode, and further forming a transparent insulating film on an upper surface of the multilayer wiring portion.

Patent Document 2 discloses a solid-state imaging apparatus including a light receiving region and a peripheral circuit region located around the light receiving region on a major surface of a light receiving element, including an external connection electrode electrically connected to the peripheral circuit region on a back surface opposite to the major surface of the light receiving element, and including a sealing resin for bonding a transparent member covering the light receiving region with a transparent adhesive and covering a side surface of the transparent member and the major surface of the light receiving element outside the region covered with the transparent member on the major surface of the light receiving element.

CITATION LIST

Patent Document

Patent Document 1: Japanese Patent Application Laid-Open No. 2006-173220

Patent Document 2: Japanese Patent Application Laid-Open No. 2008-219854

SUMMARY OF THE INVENTION

Problems to be Solved by the Invention

The package structure of each of the solid-state imaging apparatuses disclosed in the above Patent Documents 1 and 2 is manufactured by a method of so-called chip size package (CSP) or so-called wafer level chip size package (WLCSP). CSP and WLCSP each have a configuration obtained only by bonding a glass not having a ceramic substrate, a resin substrate, or the like to a silicon chip directly, and achieve reduction in height. However, the hardness is insufficient, handling reliability is low when the solid-state imaging apparatus is mounted on another substrate, and it is difficult to control warp.

The present technology has been achieved in view of the above problems, and an object of the present technology is to achieve a solid-state imaging apparatus capable of responding to requests for reduction in height and size while easily controlling warp with high handling reliability when the solid-state imaging apparatus is mounted on another substrate or the like, and a method for manufacturing such a solid-state imaging apparatus.

Solutions to Problems

One aspect of the present technology is a solid-state imaging apparatus including a substrate having a recess on a surface thereof, an imaging chip disposed and fixed on an inner bottom surface of the recess, and a filler filled and solidified in the whole of a gap between a side surface of the imaging chip and an inner surface of the recess, in which a groove having a substantially constant width is formed between the side surface of the imaging chip and the inner surface of the recess, and an expansion portion where the groove width is equal to or larger than the constant width is formed in a part of the groove.

In addition, another aspect of the present technology is a method for manufacturing a solid-state imaging apparatus, including a step of disposing and fixing an imaging chip on an inner bottom surface of a substrate having a recess on a surface thereof, and a step of filling and solidifying a filler in the whole of a gap between a side surface of the imaging chip and an inner surface of the recess, in which a groove having a substantially constant width is formed between the side surface of the imaging chip and the inner surface of the recess, and an expansion portion where the groove width is equal to or larger than the substantially constant width is formed in a part of the groove.

Note that the solid-state imaging apparatus described above includes various aspects such as an aspect in which the solid-state imaging apparatus is implemented in a state of being incorporated in another device and an aspect in which the solid-state imaging apparatus is implemented together with another method.

Effects of the Invention

According to the present technology, it is possible to achieve a solid-state imaging apparatus capable of responding to requests for reduction in height and size while easily controlling warp with high handling reliability when the solid-state imaging apparatus is mounted on another substrate or the like, and a method for manufacturing such a solid-state imaging apparatus. Note that effects described herein are merely illustrative, and are not restrictive. In addition, an additional effect may be present.

MODE FOR CARRYING OUT THE INVENTION

Hereinafter, the present technology will be described in the following order.
(1) First Embodiment:
(2) Second Embodiment:
(3) Third Embodiment:
(4) Fourth Embodiment:
(5) Fifth Embodiment:
(6) Sixth Embodiment:
(7) Seventh Embodiment:

(1) First Embodiment

Figure 1A:
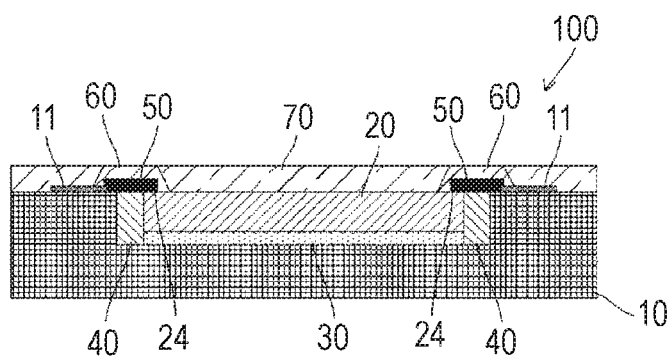
FIGS. 1A and 1B are views for explaining a configuration of a solid-state imaging apparatus according to a first embodiment.
Figure 1B:
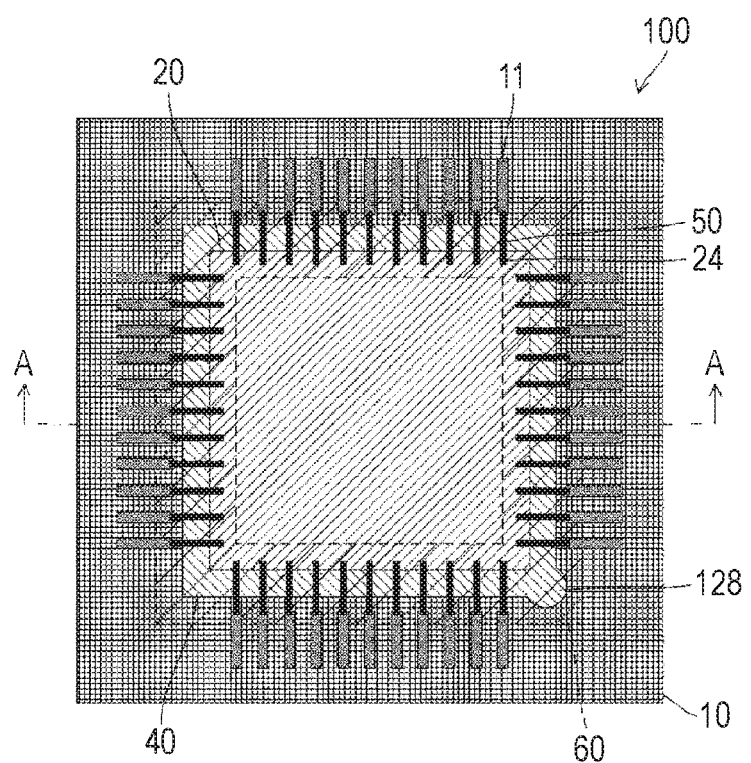
Figure 2:
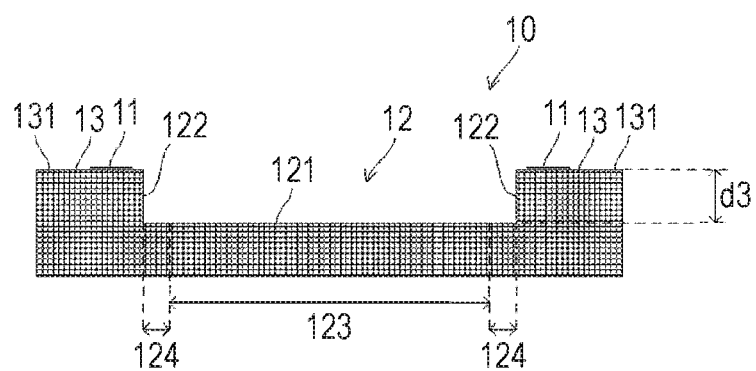
FIG. 2 is a cross-sectional view for explaining a structure of a substrate.
Figure 3:
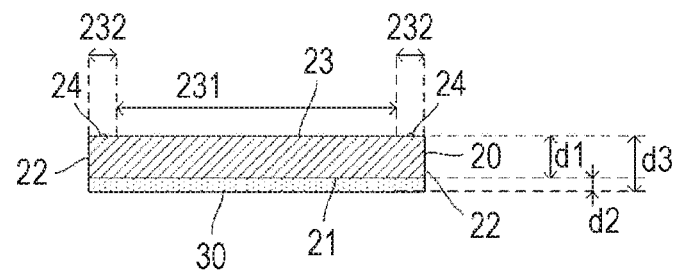
FIG. 3 is a cross-sectional view for explaining a structure of an imaging chip.
Figure 4:
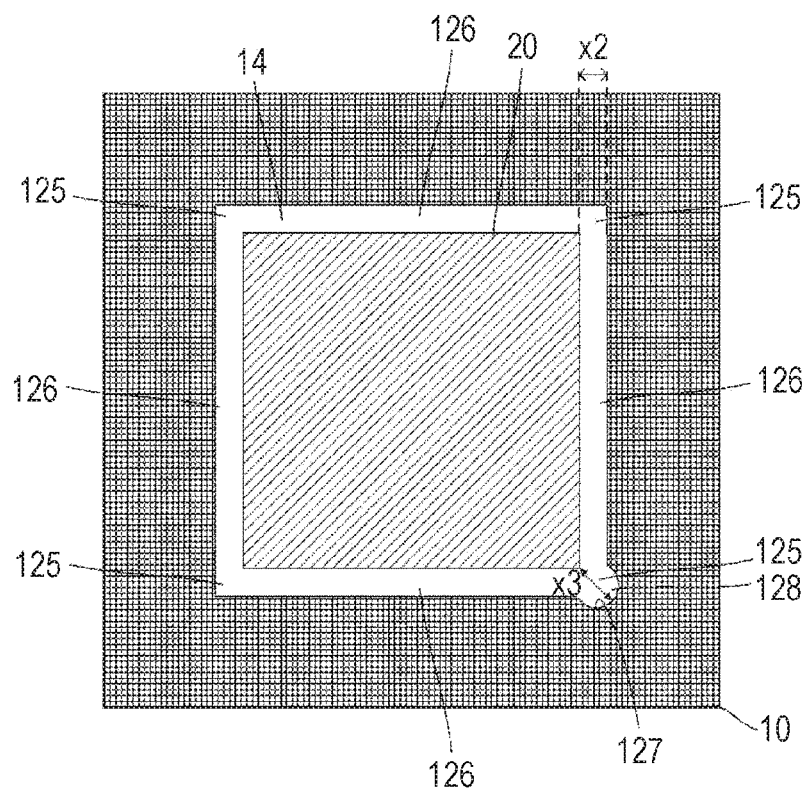
FIG. 4 is a plan view for explaining a structure formed by a substrate and an imaging chip.

FIGS. 1A and 1B are views for explaining a configuration of a solid-state imaging apparatus 100 according to the present embodiment. Incidentally, FIG. 1A is a cross-sectional view taken along line A-A of FIG. 1B, FIG. 1B is a plan view of the solid-state imaging apparatus 100, FIG. 2 is a cross-sectional view for explaining a structure of a substrate 10, FIG. 3 is a cross-sectional view for explaining a structure of an imaging chip 20, and FIG. 4 is a plan view for explaining a structure formed by the substrate 10 and the imaging chip 20. Note that a formation range of a light shielding film 60 illustrated in FIG. 1B is indicated by a broken line, and a member under the light shielding film 60 is indicated in a see-through state.

The solid-state imaging apparatus 100 includes the substrate 10, the imaging chip 20, an adhesive 30, a filler 40, bridge metal wiring 50, the light shielding film 60, and a transparent insulating film 70.

A recess 12 is formed on an upper surface of the substrate 10, and the imaging chip 20 is disposed and fixed in the recess 12. That is, a peripheral wall 13 is formed in an upright state from an inner bottom surface 121 of the recess 12, and the imaging chip 20 disposed and fixed on the inner bottom surface 121 of the recess 12 is surrounded by the peripheral wall 13. The depth of the recess 12 is set such that an upper surface 23 of the imaging chip 20 disposed and fixed on the inner bottom surface 121 of the recess 12 has a height substantially equal to a peripheral wall upper surface 131 which is an upper surface of the peripheral wall 13. Examples of the substrate 10 include a ceramic substrate, an organic resin substrate, a plastic package substrate obtained by molding a plastic (for example, refer to Japanese Patent Application Laid-Open No. 2006-173220), and the like. Note that materials of the imaging chip 20 and the substrate 10 desirably have coefficients of linear expansion equal to each other.

The inner bottom surface 121 of the recess 12 has a chip mounting area 123 on which an imaging chip is mounted and a filler area 124 on which an imaging chip is not mounted. The chip mounting area 123 is an area having the same shape as the shape of the imaging chip 20 on the inner bottom surface 121 of the recess 12, and is a rectangular area in accordance with the imaging chip 20 having a rectangular shape in plan view in the example illustrated in FIGS. 1A and 1B. The filler area 124 is an area disposed between the chip mounting area 123 and a lower end of an inner surface 122 of the recess 12 on the inner bottom surface 121 of the recess 12, and is a rectangular frame-shaped area so as to surround an outer shape of the imaging chip 20 having a rectangular shape in plan view in the example illustrated in FIGS. 1A and 1B.

The imaging chip 20 is a thin plate-shaped member fixed in the recess 12, and is an integrated circuit manufactured including a semiconductor circuit element or a semiconductor device including the integrated circuit. In the present embodiment, the imaging chip 20 has a configuration of a solid-state imaging element. That is, in the imaging chip 20, a plurality of photoelectric conversion elements such as a photodiode is disposed in an embedded manner along an upper surface of the imaging chip 20. Each of the photoelectric conversion elements generates and outputs an electric signal corresponding to incident light from the upper surface of the imaging chip 20.

A bottom surface 21 of the imaging chip 20 is fixed to the chip mounting area 123 of the inner bottom surface 121 of the recess 12 with the adhesive 30 such as a die bond or a die attach film (DAF). The upper surface 23 of the imaging chip 20 and the peripheral wall upper surface 131 have substantially equal heights to each other. Therefore, a value obtained by adding a thickness $d_2$ of the adhesive 30 to a thickness $d_1$ of the imaging chip 20 is substantially equal to a depth $d_3$ of the recess 12 (height of the peripheral wall 13).

An inner shape of the recess 12 is formed so as to be slightly larger than an outer shape of the imaging chip 20. Therefore, a gap is formed between an outer surface 22 of the imaging chip 20 and the inner surface 122 of the recess 12. This gap constitutes a rectangular frame-shaped and ditch-shaped groove 14 surrounding the imaging chip 20. In the groove 14, an inner side wall is constituted by the outer surface 22 of the imaging chip 20, an outer side wall is constituted by the inner surface 122 of the recess 12, and a bottom surface is constituted by the filler area 124 of the inner bottom surface 121 of the recess 12.

The groove width of the groove 14 is substantially constant over almost the entire periphery of the imaging chip 20. The groove 14 is formed according to a margin corresponding to the accuracy of a device for disposing and fixing the imaging chip 20 in the recess 12. For example, in a case where the margin is about 0.1 mm, the groove width is about 0.1 mmm to 1.0 mm. Incidentally, in a case where the groove 14 has a rectangular frame shape as in the present embodiment, the groove width of the groove 14 corresponding to a side 126 is substantially constant, but the groove width of the groove 14 in a diagonal direction, corresponding to a corner 125, is about 1.4 times (root 2) the groove width of the side 126.

If the filler 40 is filled and cured in the groove 14 to stably support the imaging chip 20 in the recess 12, the filler 40 is filled and cured in a rectangular frame shape surrounding the imaging chip 20 in the groove 14. Note that an upper surface of the filler 40 filled and cured in the groove 14 desirably has a height substantially equal to the upper surface 23 of the imaging chip 20 and the peripheral wall upper surface 131.

As the filler 40, for example, an underfill material or the like is used, and a material that generates a capillary phenomenon in the groove 14 is selected. That is, as the filler 40, a material having good wettability with a side surface of the groove 14 (the outer surface 22 of the imaging chip 20, the inner surface 122 of the recess 12, and the filler area 124 of the inner bottom surface 121 of the recess 12) and having a viscosity of about 0.1 to 100 Pa·s at the time of injection is used, and a material in which the size of a filler material included therein is smaller than the width of the groove 14 is selected. The size of the filler material is desirably ⅓ or less of the groove width of the groove 14 other than an expansion portion 128. That is, if the size of the filler material is $x_1$, the width of the narrowest portion of the groove 14 is $x_2$, and the width of the expansion portion 128 described later is $x_3$, a material satisfying a relationship of $x_1 < x_2 < x_3$ is used as the filler 40.

The expansion portion 128 obtained by extending an outer side wall of the rectangular frame-shaped groove 14 outward is formed in at least one location of the groove 14. That is, a lead-in portion 127 recessed outward in plan view is formed in at least a part of the inner surface 122 of the recess 12 of the substrate 10. By forming the lead-in portion 127 on the inner surface 122 of the recess 12, it is possible to form the expansion portion 128 having a larger width than the groove 14 in a case where the groove 14 is formed with a substantially constant groove width over the entire periphery of the imaging chip 20. Note that the lead-in portion 127 having an arc shape in plan view and the cylindrical expansion portion 128 are illustrated in the drawing. However, the shapes of the lead-in portion 127 and the expansion portion 128 are not limited thereto and may be rectangular, polygonal, or the like.

Figure 5A:
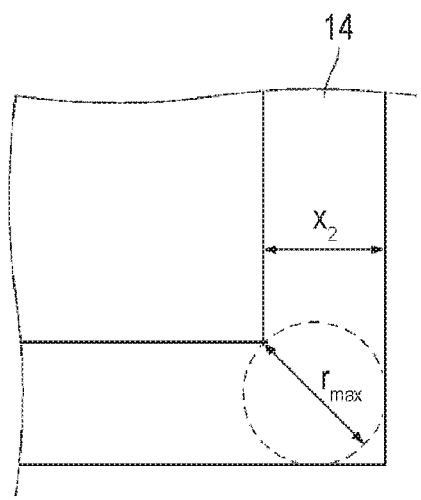
FIGS. 5A and 5B are views for explaining the size of an expansion portion according to the first embodiment.
Figure 5B:
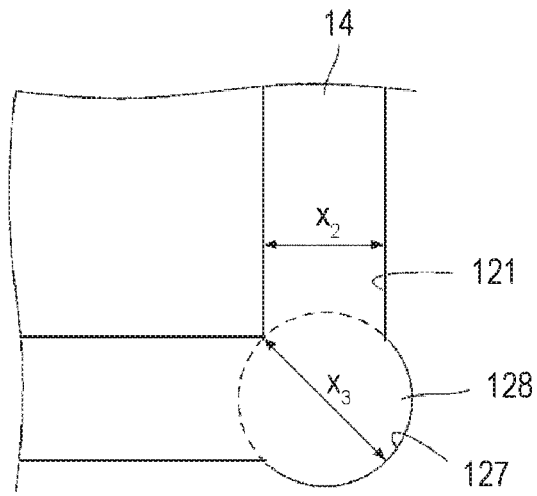

FIGS. 5A and 5B are views for explaining the size of the expansion portion 128 according to the present embodiment. In the present embodiment, the expansion portion 128 is formed in the corner 125. FIGS. 5A and 5B illustrate the diameter of a cylindrical member that can be inserted into the groove 14 while a case where the expansion portion 128 is not formed in the corner 125 (FIG. 5A) is compared with a case where the expansion portion 128 is formed in the corner 125 (FIG. 5B). Generally, on-substrate wiring 11, the bridge metal wiring 50, and a terminal 24 on the imaging chip 20, described later, are concentratedly disposed along the side 126. In a case where the expansion portion 128 is formed in the corner 125, it is easy to design the on-substrate wiring 11 and the bridge metal wiring 50.

FIG. 5A illustrates the maximum shape of the cylindrical member that can be inserted into the corner 125 in a case where the expansion portion 128 is not formed by a broken line. The maximum diameter of the cylindrical member that can be inserted in the corner 125 is represented by rmax, and the width of the groove 14 in the side 126 is represented by x2.

In the present embodiment, the expansion portion 128 is formed in such a shape that the maximum diameter of the cylindrical member that can be inserted into the corner 125 is larger than rmax. For example, as illustrated in FIG. 5B, the lead-in portion 127 is formed on the inner side wall 121 of the corner 125 of the recess 12 in plan view so as to draw a convex arc in plan view outward. As a result, the maximum diameter (size x3 of the expansion portion 128) of the cylindrical member that can be inserted into the expansion portion 128 formed in the corner 128 is larger than rmax, and the degree of freedom in selecting the size of a discharge port of a device for filling the filler 40 in the groove 14 is improved.

The upper surface 23 of the imaging chip 20 has a light incident area 231 corresponding to a disposition range of a plurality of solid-state imaging elements for generating and outputting an electric signal corresponding to incident light and a non-light incident area 232 not corresponding to a disposition range of a solid-state imaging elements for generating and outputting an electric signal corresponding to incident light. The non-light incident area 232 is formed in a frame shape along the entire periphery of an edge of the upper surface 23 of the imaging chip 20. The light incident area 231 is surrounded by the non-light incident area 232 on the upper surface 23 of the imaging chip 20.

In the non-light incident area 232 of the imaging chip 20, a plurality of terminals 24 to be electrically connected to an outside is disposed. A plurality of terminals 24 is juxtaposed along an edge of the imaging chip 20.

Meanwhile, on an upper surface of the peripheral wall 13 of the substrate 10, the terminals 24 and a plurality of the on-substrate wiring 11 are disposed at positions corresponding to each other across the groove 14. An end of the on-substrate wiring 11 extends to an edge close to the groove 14 on the peripheral wall 13. The terminals 24 are connected to the ends of the on-substrate wiring 11 close to the groove 14 by the bridge metal wiring 50 disposed across the groove 14, respectively.

The bridge metal wiring 50 is obtained by forming a conductive metal paste material such as a gold paste, a silver paste, a copper paste, or a solder paste into a thin film, for example, by screen printing. By forming the wiring by screen printing, the bridge metal wiring 50 can be formed with a thickness of 50 μm or less, for example, with a thickness of about 1 to 25 μm. Note that a thickness of about 100 to 300 μm is required in a case where similar wiring is formed with a wire loop.

Note that the filler 40 filled and cured in the groove 14 may have irregularities formed on a surface thereof or may be shrunk upon curing to have a surface recessed downward from a surface of the imaging chip 20 or the peripheral wall 13. Therefore, an insulating material may be laminated on the surface of the filler 40 along the groove 14 by screen printing or the like such that the upper surface is flat. As a result, the surface of the groove 14 is flattened and can reliably be connected by wiring without being affected by steps or irregularities when the bridge metal wiring 50 is disposed.

The bridge metal wiring 50 is covered with the light shielding film 60. A formation range of the light shielding film 60 for an upper surface side of the peripheral wall 13 of the substrate 10 is not particularly limited. However, a formation range of the light shielding film 60 for an upper surface of the imaging chip 20 is up to a side of the non-light incident area 232 with respect to the boundary between the non-light incident area 232 and the light incident area 231. Therefore, the light shielding film 60 may be formed so as to cover only the disposition range of the bridge metal wiring 50, or may be formed so as to cover both the bridge metal wiring 50 and the on-substrate wiring 11. As a result, the light shielding film 60 does not hinder light incident on the photoelectric conversion element while occurrence of an optical problem such as flare or ghost due to reflected light of the bridge metal wiring 50 (and the on-substrate wiring 11) is suppressed.

In addition, an edge of the light shielding portion 60 close to the light incident area 231 has a tapered shape having a lower height as the edge is closer to the light incident area 231. As a result, probability that the light shielding portion 60 shields light obliquely incident on the light incident area 231 is reduced, and the light receiving sensitivity of the imaging element is not lowered.

The transparent insulating film 70 is laminated above the imaging chip 20, above the peripheral wall 13, and on the light shielding portion 60 (also on the filler 40 and the bridge metal wiring 50 in a case where the filler 40 and the bridge metal wiring 50 are exposed from the light shielding portion 60). As a result, it is possible to protect and insulate the imaging chip 20, the on-substrate wiring 11 on the peripheral wall 13, and the bridge metal wiring 50 from an outside. An antireflection film may be laminated on an upper surface of the transparent insulating film 70 as necessary, or lamination may be performed, for example, by bonding a glass having functionality such as an antireflection film. In this case, the upper surface of the transparent insulating film 70 is flattened by CMP or the like as necessary.

In a case where sharpness is required for an imaged image of the imaging chip 20, as the transparent insulating film 70, a material having a refractive index higher than a material of an on-chip microlens disposed in the imaging chip 20 is used on the basis of Snell's law. For example, in a case where the on-chip microlens is formed with a silicon nitride film (Si3N4) having a refractive index of about 2, the transparent insulating film 70 is formed with an epoxy resin having a refractive index of about 1.5.

The solid-state imaging apparatus 100 configured as described above has no hollow structure (so-called cavity) which a conventional general solid-state imaging apparatus has, and therefore can reduce the height and size thereof as compared with the conventional solid-state imaging apparatus. WLCSP and other technologies have superiority if only simple reduction in height and size is aimed at. However, the solid-state imaging apparatus according to the present technology is advantageous in that it is possible to achieve reduction in height and size while also achieving ease of handling when the solid-state imaging apparatus 100 is mounted on another substrate or the like due to use of the solid substrate 10. That is, a solid-state imaging apparatus manufactured by WLCSP is too thin, and handling, alignment, or the like is difficult with a device for mounting a conventional solid-state imaging apparatus at a predetermined position on a substrate unless a support member or the like is separately disposed. However, the solid-state imaging apparatus 100 according to the present technology uses the substrate 10 that has been conventionally handled, and therefore it is possible to use a device that has been conventionally used as it is. In addition, there is no hollow structure, and therefore probability that moisture enters a cavity, an image quality is degraded due to fogging, discoloration, or the like, and an image sensor or the like is influenced by the moisture is extremely low.

(2) Second Embodiment

Figure 6A:
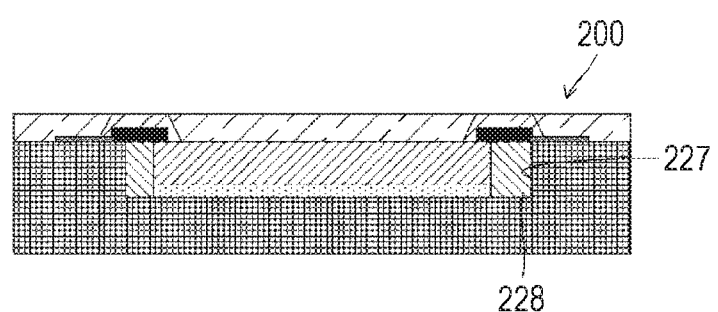
FIGS. 6A and 6B are views for explaining a configuration of a solid-state imaging apparatus according to a second embodiment.
Figure 6B:
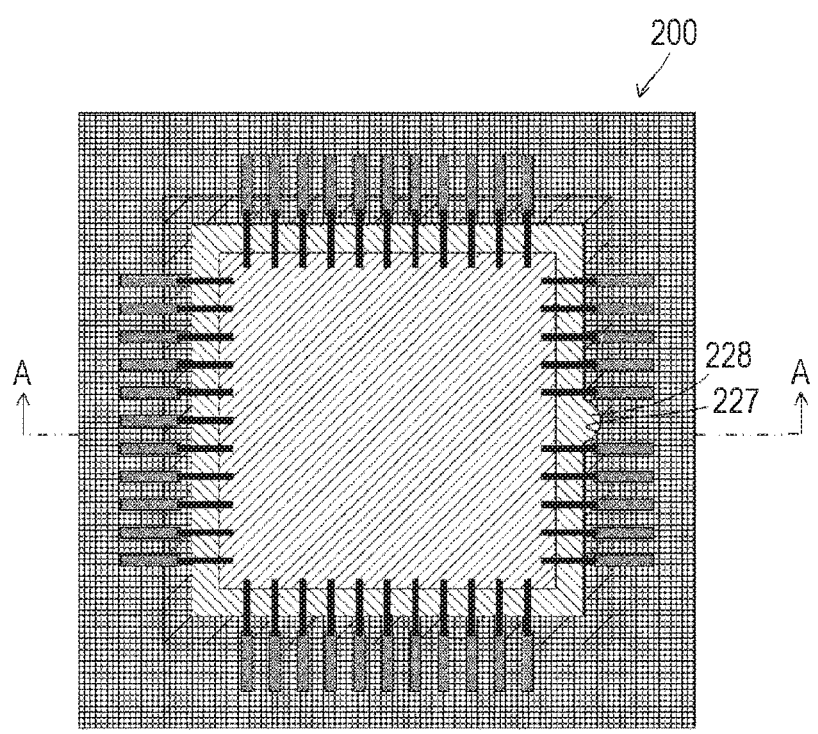

FIGS. 6A and 6B are views for explaining a configuration of a solid-state imaging apparatus 200 according to the present embodiment. Incidentally, FIG. 6A is a cross-sectional view taken along line A-A of FIG. 6B, and FIG. 6B is a plan view of the solid-state imaging apparatus 200.

The solid-state imaging apparatus 200 illustrated in FIGS. 6A and 6B is similar to the solid-state imaging apparatus 100 according to the first embodiment except for the position where an expansion portion is disposed in a groove 14. Therefore, hereinafter, description of configurations other than the expansion portion will be omitted, and the configurations other than the expansion portion will be described using the same reference numerals as those of the solid-state imaging apparatus 100.

In the present embodiment, an expansion portion 228 obtained by extending an outer side wall of the rectangular frame-shaped groove 14 outward is formed in a side 126 of the groove 14. That is, a lead-in portion 227 recessed outward in plan view is formed in at least a part of an inner surface 122 of a recess 12 of a substrate 10. By forming the lead-in portion 227 on the inner surface 122 of the recess 12, it is possible to form the expansion portion 228 having a larger width than the groove 14 in a case where the groove 14 is formed with a substantially constant groove width over the entire periphery of an imaging chip 20.

Figure 7A:
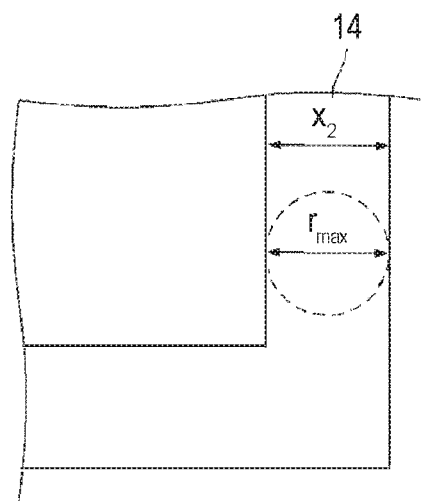
FIGS. 7A and 7B are views for explaining the size of an expansion portion according to the second embodiment.
Figure 7B:
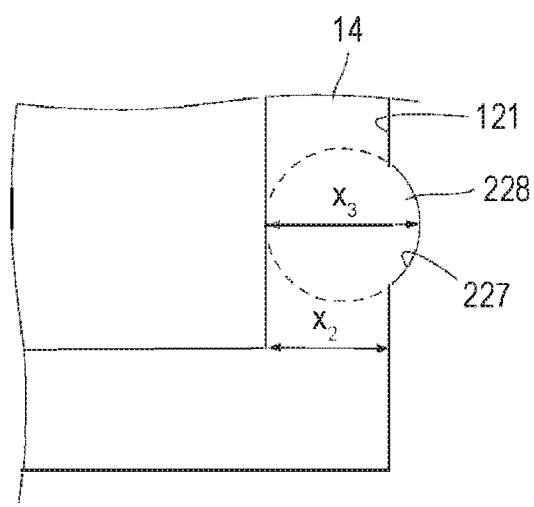

FIGS. 7A and 7B are views for explaining the size of the expansion portion 228 according to the present embodiment. In the present embodiment, the expansion portion 228 is formed in the side 126. FIGS. 7A and 7B illustrate the diameter of a cylindrical member that can be inserted into the groove 14 while a case where the expansion portion 228 is not formed at the side 126 (FIG. 7A) is compared with a case where the expansion portion 228 is formed in the side 126 (FIG. 7B).

FIG. 7A illustrates the maximum diameter of the cylindrical member that can be inserted into the side 126 in a case where the expansion portion 228 is not formed. In this case, as illustrated in FIG. 7A, a maximum diameter rmax of the cylindrical member that can be inserted into the side 126 is substantially equal to a width x2 of the groove 14 in the side 126.

In the present embodiment, the expansion portion 228 is formed in such a shape that the maximum diameter of the cylindrical member that can be inserted into the expansion portion 228 is larger than rmax. For example, as illustrated in FIG. 7B, the lead-in portion 227 is formed on an inner side wall 121 of the side 126 of the recess 12 in plan view so as to draw a convex arc in plan view outward. As a result, the maximum diameter (size x3 of the expansion portion 228) of the cylindrical member that can be inserted into the expansion portion 228 formed in the side 126 is larger than rmax, and the degree of freedom in selecting the size of a discharge port of a device for filling a filler 40 in the groove 14 is improved.

(3) Third Embodiment

Figure 8A:
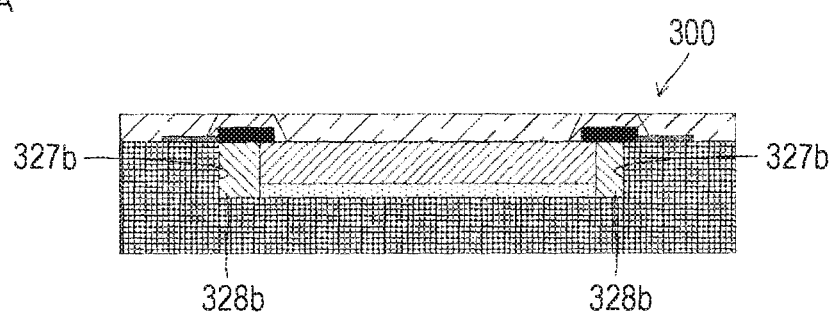
FIGS. 8A and 8B are views for explaining a configuration of a solid-state imaging apparatus according to a third embodiment.
Figure 8B:
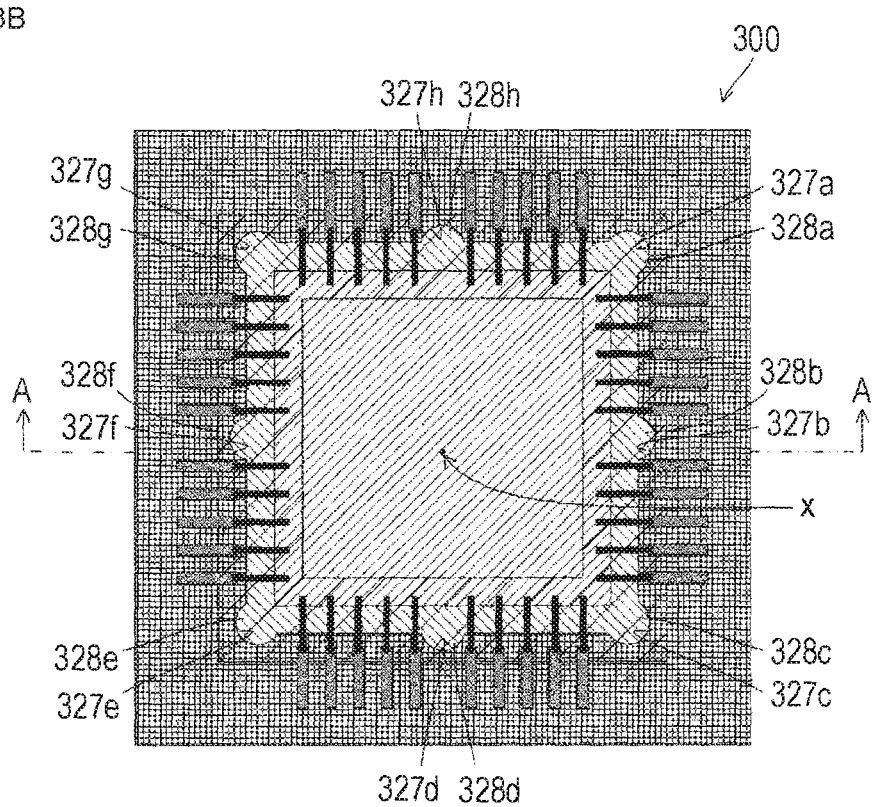

FIGS. 8A and 8B are views for explaining a configuration of a solid-state imaging apparatus 300 according to the present embodiment. Incidentally, FIG. 8A is a cross-sectional view taken along line A-A of FIG. 8B, and FIG. 8B is a plan view of the solid-state imaging apparatus.

The solid-state imaging apparatus 300 illustrated in FIGS. 8A and 8B are similar to the solid-state imaging apparatus 100 according to the first embodiment except for the position where an expansion portion is formed in a groove 14 and the number of the expansion portions. Therefore, hereinafter, description of configurations other than the expansion portion will be omitted, and the configurations other than the expansion portion will be described using the same reference numerals as those of the solid-state imaging apparatus 100.

In the present embodiment, expansion portions 328a to 328h obtained by extending an outer side wall of the rectangular frame-shaped groove 14 outward are formed in a plurality of corners 125 of the groove 14 and in a plurality of sides 126 of the groove 14.

That is, lead-in portions 327a to 327h recessed outward in plan view are formed in an inner surface 122 of a recess 12 of a substrate 10. By forming the lead-in portions 327a to 327h on the inner surface 122 of the recess 12, it is possible to form the plurality of expansion portion 328a to 328h each having a larger width than the groove 14 in a case where the groove 14 is formed with a substantially constant groove width over the entire periphery of an imaging chip 20.

In the present embodiment, the expansion portions 328a to 328h are formed in a point symmetrical positional relationship with the center of the recess 12 or the imaging chip 20 as a target axis X. That is, with respect to the symmetry axis X, the expansion portion 328a is formed in a point symmetrical positional relationship with the expansion portion 328e, the expansion portion 328b is formed in a point symmetrical positional relationship with the expansion portion 328f, the expansion portion 328c is formed in a point symmetrical positional relationship with the expansion portion 328g, and the expansion portion 328d is formed in a point symmetrical positional relationship with the expansion portion 328h.

Incidentally, the size of each of the expansion portions 328a, 328c, 328e, and 328g formed in the corners 125 and the shape of a lead-in portion formed corresponding to each of the expansion portions 328a, 328c, 328e, and 328g are similar to those of the first embodiment, and the size of each of the expansion portions 328b, 328d, 328f, and 328h formed in the sides 126 and the shape of a lead-in portion formed corresponding to each of the expansion portions 328b, 328d, 328f, and 328h are similar to those of the second embodiment. In addition, for example, by forming the expansion portions 328b, 328d, 328f, and 328h to be formed in the sides 126 at approximately midpoints of the corners at both ends thereof, the expansion portions are desirably formed uniformly over the entire groove 14.

In this way, by forming the expansion portions at a plurality of positions, it is possible to fill a filler 40 in the groove 14 and to easily spread the filler 40 over the entire groove 14, and it is possible to shorten time for filling the filler and to improve reliability for filling the groove 14.

(4) Fourth Embodiment

FIGS. 9A, 9B, 9C, 9D, 9E, 9F, and 9G are views for explaining a method for manufacturing the solid-state imaging apparatuses 100 to 300. Incidentally, the reference numerals of detailed parts are not illustrated in FIG. 10, and description will be made with the reference numerals illustrated in FIGS. 1A, 1B, 2, 3, 4, 5A, and 5B as necessary.

Figure 9A:
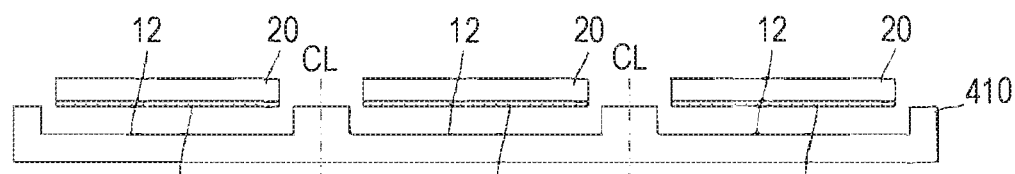
FIGS. 9A, 9B, 9C, 9D, 9E, 9F, and 9G are views for explaining a method for manufacturing a solid-state imaging apparatus according to a fourth embodiment.

In the manufacturing method according to the present embodiment, first, a coupling substrate 410 and a plurality of imaging chips 20 are prepared (FIG. 9A). A plurality of recesses 12 is regularly formed on an upper surface of the coupling substrate 410. When the coupling substrate 410 is cut along a cut line CL and divided into individual pieces, a plurality of substrates 10 is obtained. Examples of the coupling substrate 410 include a ceramic substrate, an organic resin substrate, a plastic package substrate obtained by molding a plastic, and the like. Note that a material of the imaging chip 20 desirably has a coefficient of linear expansion equal to that of the coupling substrate 410.

Figure 9B:
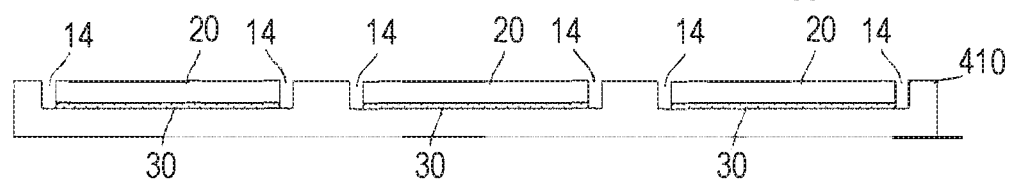
Figure 9C:
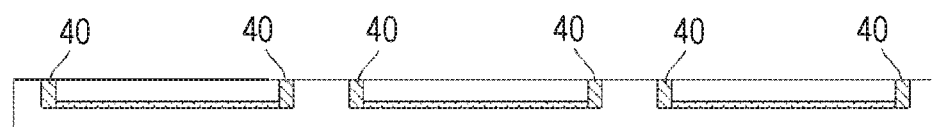

Subsequently, the imaging chip 20 is disposed in a chip mounting area 123 of each recess 12 of the coupling substrate 410, and fixed by an adhesive 30 such as a die bond or a die attach film (DAF) (FIG. 9B). The inner shape and size of the recess 12 and the outer shape and size of the imaging chip 20 are substantially equal to each other. However, a margin is formed such that the inner shape and size of the recess 12 are slightly larger than the outer shape and size of the imaging chip 20. This margin is determined in accordance with the accuracy of a mounting device for disposing the imaging chip 20 in the recess 12. Margins equal to or larger than an error in horizontal position control of the mounting device are formed on the upper, lower, left, and right sides, respectively. For example, in a case where an error of the mounting device is 0.1 mm, the outer shape of the recess 12 is formed so as to be larger by about 0.1 mm to 1.0 mm in each of upper, lower, left, and right sides than the outer shape of the imaging chip 20.

Subsequently, the filler 40 is filled in the groove 14 formed in a gap between the recess 12 and the imaging chip 20 due to the margin described above, and is cured by heating or the like (FIG. 9C). This filling of the filler 40 is performed by inserting a tip of a nozzle of a filling machine into the expansion portion 128, 228, or 328a to 328h formed in at least one location of the groove 14. The liquid filler 40 filled in the expansion portion 128, 228, or 328a to 328h flows due to a capillary phenomenon so as to spread over the entire groove 14. That is, wettability between the filler 40 and a side surface of the groove 14 (the outer surface 22 of the imaging chip 20, the inner surface 122 of the recess 12, and the filler area 124 of the inner bottom surface 121 of the recess 12) is good. The filler 40 has a viscosity of about 0.1 to 100 Pas at the time of injection. The size of a filler material included in the filler 40 is smaller than the width of the groove 14. The size of the filler material is desirably ⅓ or less of the groove width of the groove 14 other than the expansion portion 128, 228, or 328a to 328h. That is, if the size of the filler material is x1, the width of the narrowest portion of the groove 14 is x2, and the width of the expansion portion 128, 228, or each of 328a to 328h is x3, a material satisfying a relationship of x1<x2<x3 is used as the filler 40.

Subsequently, a filling resin is screen-printed on a surface of the filler 40 as necessary to flatten a surface side of the filler 40. That is, even in a case where the portion of the filler 40 is recessed due to shrinkage caused at the time of curing the filler 40, or a step is generated between the filler 40 and an upper surface of the peripheral wall 13 or an upper surface of the imaging chip 20, the shape on the surface side of the filler 40 can be formed into a constant shape with the filling resin. Incidentally, when the filling resin is screen-printed, the surface side of the filler 40 slightly rises by the thickness of a mask disposed for screen printing compared with the upper surface of the peripheral wall 13 of the substrate 10 and the surface of the imaging chip 20.

Figure 9D:
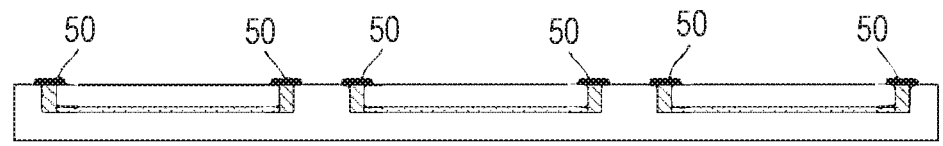

Subsequently, bridge metal wiring 50 for electrically connecting a terminal 24 of the imaging chip 20 to on-substrate wiring 11 formed on the upper surface of the peripheral wall 13 is formed into a thin film by screen printing across the filler 40 (FIG. 9D). For a wiring material, a conductive metal paste material such as a gold paste, a silver paste, a copper paste, or a solder paste is used. At this time, the surface side of the filler 40 is flattened with the filling resin as described above, and therefore the wiring quality of the bridge metal wiring 50 can be stabilized. Note that wiring formed by screen printing can be formed with a thickness of 50 µm or less, and can be formed with a thickness of, for example, about 1 to 25 µm.

Figure 9E:
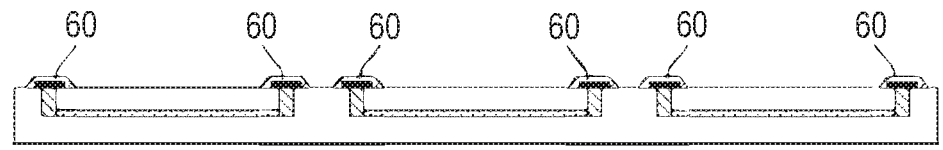

Subsequently, a light shielding film 60 is formed by screen printing or the like so as to cover the bridge metal wiring 50 (FIG. 9E). In the present embodiment, the light shielding film 60 is formed so as to collectively cover the plurality of bridge metal wiring 50 in a direction in which the groove 14 extends above the groove 14 into a rectangular frame shape covering an edge on the groove 14 side of an upper surface of the peripheral wall 13 and an edge on the groove 14 side of the non-light incident area 232 of the imaging chip 20. An edge of the light shielding portion 60 close to the light incident area 231 has a tapered shape having a lower height as the edge is closer to the light incident area 231.

Figure 9F:
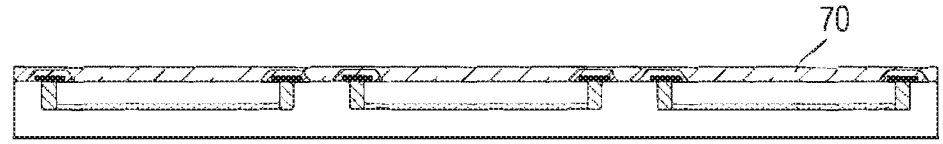

Subsequently, the transparent insulating film 70 is formed on the entire upper surface of the coupling substrate 410 (FIG. 9F). The transparent insulating film 70 can be formed by screen printing or spin coating. Note that screen printing is better in flatness because sweeping unevenness is not formed on the surface shape of the transparent insulating film 70. However, the surface may be flattened by separately performing a process such as chemical mechanical polishing (CMP). In this case, the transparent insulating film 70 is formed so as to be slightly thick in consideration of the thickness reduced by polishing.

As a material of the transparent insulating film 70, a material having a refractive index higher than that of a material of an on-chip microlens disposed in the imaging chip 20 is used. For example, in a case where the on-chip microlens is formed with a silicon nitride film ($Si_3N_4$) having a refractive index of about 2, the transparent insulating film 70 is formed with an epoxy resin having a refractive index of about 1.5.

Thereafter, an antireflection film is formed on the transparent insulating film 70, or a glass plate having an antireflection film is mounted and fixed as necessary. Note that it is not necessary to dispose an antireflection film in applications in which optical blurring such as flare is not a problem.

Figure 9G:
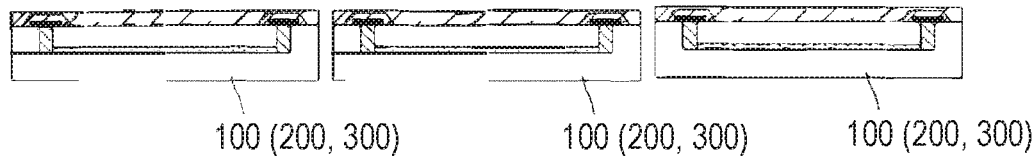

Finally, the coupling substrate 410 is cut along the cut line CL, and a solid-state imaging apparatus in which the imaging chip 20 is embedded and fixed with the filler 40 in the recess 12 of the substrate 10 is divided into individual pieces (FIG. 9G). According to the manufacturing method described above, the solid-state imaging apparatuses 100, 200, and 300 according to the first, second, and third embodiments described above can be manufactured, respectively.

(5) Fifth Embodiment

The technology according to the present disclosure (the present technology) can be applied to various products. For example, the technology according to the present disclosure may be achieved as an apparatus mounted on any type of mobile body such as an automobile, an electric vehicle, a hybrid electric vehicle, a motorcycle, a bicycle, a personal mobility, an airplane, a drone, a ship, or a robot.

Figure 10:
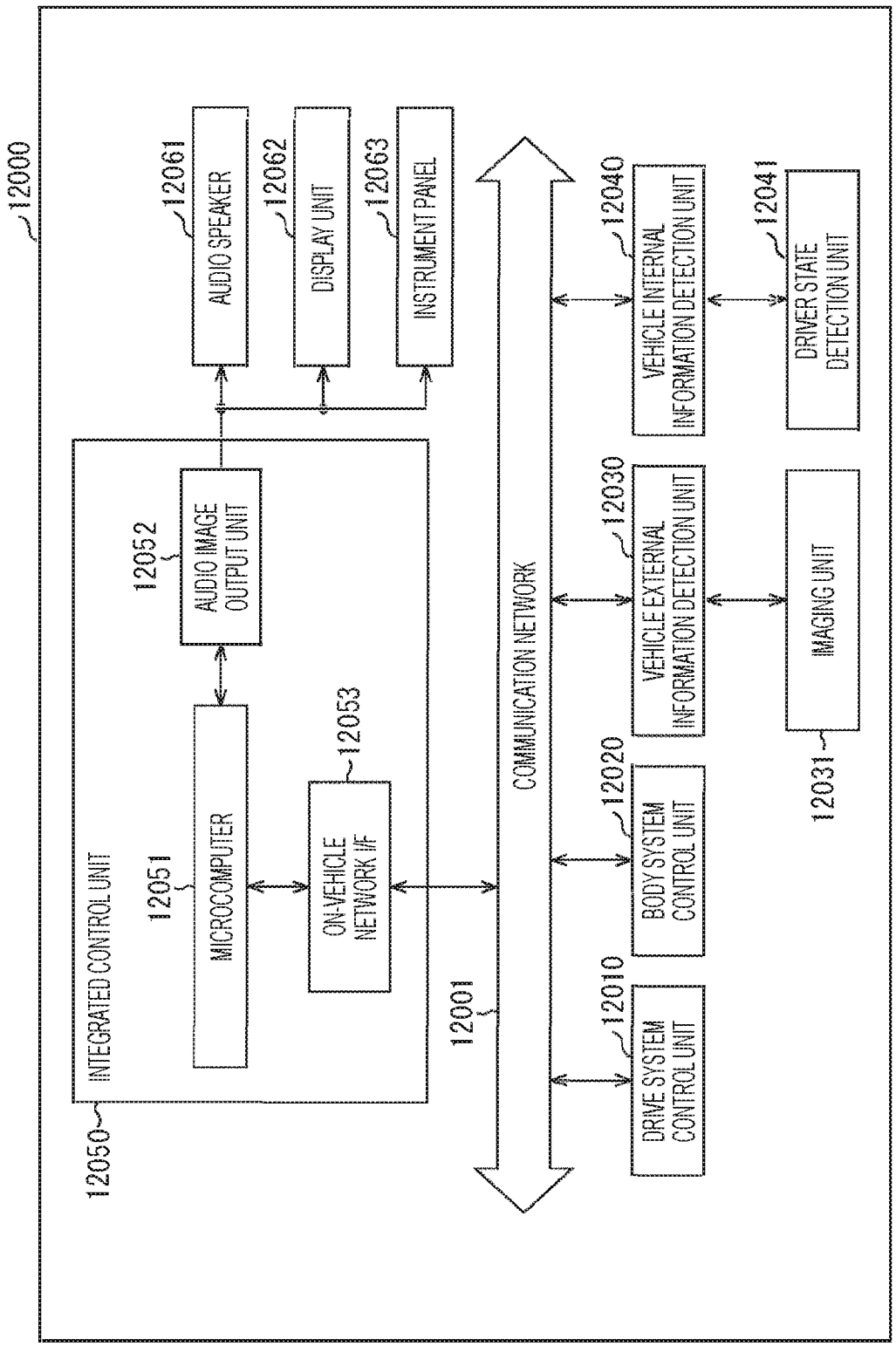
FIG. 10 is a block diagram illustrating an example of a schematic configuration of a vehicle control system.

FIG. 10 is a block diagram illustrating an example of a schematic configuration of a vehicle control system which is an example of a mobile body control system to which the technology according to the present disclosure can be applied.

A vehicle control system 12000 includes a plurality of electronic control units connected to one another via a communication network 12001. In the example illustrated in FIG. 10, the vehicle control system 12000 includes a drive system control unit 12010, a body system control unit 12020, a vehicle external information detection unit 12030, a vehicle internal information detection unit 12040, and an integrated control unit 12050. In addition, as a functional configuration of the integrated control unit 12050, a microcomputer 12051, an audio image output unit 12052, and an on-vehicle network interface (I/F) 12053 are illustrated.

The drive system control unit 12010 controls an operation of a device related to a drive system of a vehicle according to various programs. For example, the drive system control unit 12010 functions as a control device of a driving force generating device for generating a driving force of a vehicle such as an internal combustion engine or a driving motor, a driving force transmitting mechanism for transmitting a driving force to wheels, a steering mechanism for adjusting a rudder angle of a vehicle, a braking device for generating a braking force of a vehicle, or the like.

The body system control unit 12020 controls operations of various devices mounted on a vehicle body according to various programs. For example, the body system control unit 12020 functions as a control device of a keyless entry system, a smart key system, a power window device, or various lamps such as a head lamp, a back lamp, a brake lamp, a turn indicator, and a fog lamp. In this case, to the body system control unit 12020, a radio wave transmitted from a portable device substituted for a key or signals of various switches can be input. The body system control unit 12020 receives input of the radio wave or signals and controls a door lock device, a power window device, a lamp, and the like of a vehicle.

The vehicle external information detection unit 12030 detects information outside a vehicle on which the vehicle control system 12000 is mounted. For example, to the vehicle external information detection unit 12030, an imaging unit 12031 is connected. The vehicle external information detection unit 12030 causes the imaging unit 12031 to image an image outside a vehicle and receives an imaged image. The vehicle external information detection unit 12030 may perform object detection processing or distance detection processing of a person, a car, an obstacle, a sign, a character on a road surface, or the like on the basis of the received image.

The imaging unit 12031 is a light sensor for receiving light and outputting an electric signal corresponding to the amount of light received. The imaging unit 12031 can output an electric signal as an image or output the electric signal as distance measurement information. In addition, the light received by the imaging unit 12031 may be visible light or invisible light such as infrared light.

The vehicle internal information detection unit 12040 detects information inside a vehicle. To the vehicle internal information detection unit 12040, for example, a driver state detection unit 12041 for detecting the state of a driver is connected. The driver state detection unit 12041 includes, for example, a camera for imaging a driver. The vehicle internal information detection unit 12040 may calculate the degree of fatigue or the degree of concentration of a driver or may determine whether the driver is dozing off on the basis of detection information input from the driver state detection unit 12041.

The microcomputer 12051 can calculate a control target value of a driving force generating device, a steering mechanism, or a braking device on the basis of information inside and outside a vehicle, acquired by the vehicle external information detection unit 12030 or the vehicle internal information detection unit 12040, and can output a control command to the drive system control unit 12010. For example, the microcomputer 12051 can perform cooperative control aiming at realizing a function of advanced driver assistance system (ADAS) including collision avoidance or impact mitigation of a vehicle, following travel based on inter-vehicle distance, vehicle speed maintenance travel, vehicle collision warning, vehicle lane departure warning, and the like.

In addition, the microcomputer 12051 can perform cooperative control aiming at, for example, automatic driving that autonomously travels without depending on driver's operation by controlling a driving force generating device, a steering mechanism, a braking device, or the like on the basis of information around a vehicle, acquired by the vehicle external information detection unit 12030 or the vehicle internal information detection unit 12040.

In addition, the microcomputer 12051 can output a control command to the body system control unit 12020 on the basis of vehicle external information acquired by the vehicle external information detection unit 12030. For example, the microcomputer 12051 can perform cooperative control aiming at antiglare such as switching from high beam to low beam by controlling a headlamp according to the position of a preceding vehicle or an oncoming vehicle detected by the vehicle external information detection unit 12030.

The audio image output unit 12052 transmits an audio output signal and/or an image output signal to an output device capable of visually or audibly notifying a passenger of a vehicle or the outside of the vehicle of information. In the example of FIG. 10, as the output device, an audio speaker 12061, a display unit 12062, and an instrument panel 12063 are illustrated. The display unit 12062 may include an on-board display and/or a head-up display, for example.

Figure 11:
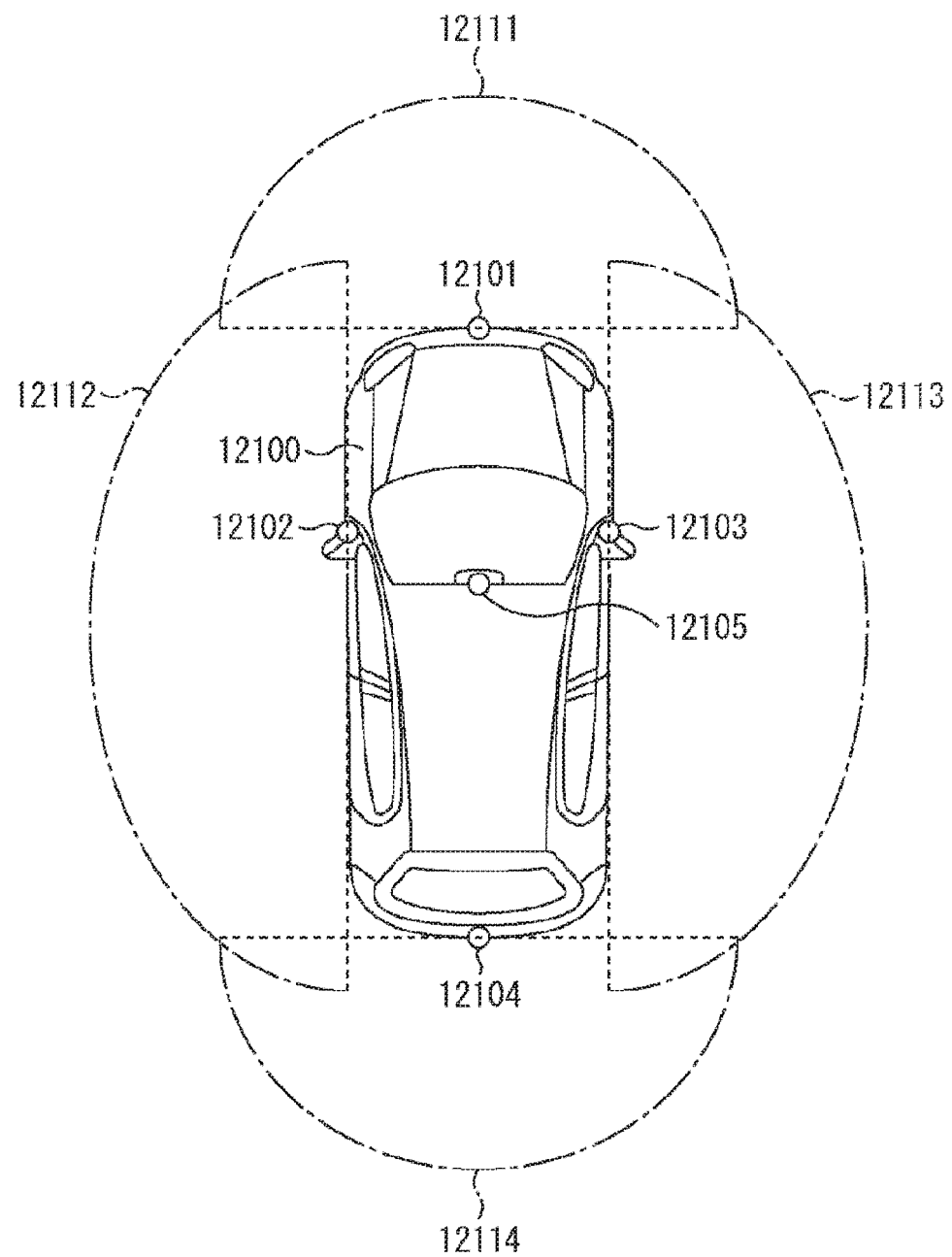
FIG. 11 is an explanatory diagram illustrating examples of installation positions of a vehicle external information detection unit and an imaging unit.

FIG. 11 is a diagram illustrating an example of an installation position of the imaging unit 12031.

In FIG. 11, the vehicle 12100 includes imaging units 12101, 12102, 12103, 12104, and 12105 as the imaging unit 12031.

The imaging units 12101, 12102, 12103, 12104, and 12105 are disposed, for example, in a front nose, a side mirror, a rear bumper, and a back door of the vehicle 12100, in an upper portion of a front glass in a passenger compartment, and the like. The imaging unit 12101 disposed in a front nose and the imaging unit 12105 disposed in an upper portion of a front glass in a passenger compartment mainly acquire images in front of the vehicle 12100. The imaging units 12102 and 12103 disposed in side mirrors mainly acquire images on sides of the vehicle 12100. The imaging unit 12104 disposed in a rear bumper or a back door mainly acquires an image behind the vehicle 12100. The front images acquired by the imaging units 12101 and 12105 are mainly used for detecting a preceding vehicle, a pedestrian, an obstacle, a traffic signal, a traffic sign, a lane, or the like.

Note that FIG. 11 illustrates examples of imaging ranges of the imaging units 12101 to 12104. An imaging range 12111 indicates an imaging range of the imaging unit 12101 disposed in a front nose. Imaging ranges 12112 and 12113 indicate imaging ranges of the imaging units 12102 and 12103 disposed in side mirrors, respectively. An imaging range 12114 indicates an imaging range of the imaging unit 12104 disposed in a rear bumper or a back door. For example, by superimposing image data imaged by the imaging units 12101 to 12104 on one another, an overhead view image of the vehicle 12100 viewed from above is obtained.

At least one of the imaging units 12101 to 12104 may have a function of acquiring distance information. For example, at least one of the imaging units 12101 to 12104 may be a stereo camera including a plurality of imaging elements, or may be an imaging element having pixels for phase difference detection.

For example, the microcomputer 12051 determines a distance to each three-dimensional object in the imaging range 12111 to 12114 and a temporal change (relative speed with respect to the vehicle 12100) of the distance on the basis of the distance information obtained from the imaging units 12101 to 12104, and can thereby particularly extract a three-dimensional object which is the nearest three-dimensional object on a traveling path of the vehicle 12100 and is traveling at a predetermined speed (for example, 0 km/h or more) in substantially the same direction as the vehicle 12100 as a preceding vehicle. Furthermore, the microcomputer 12051 can set an inter-vehicle distance to be secured in advance in front of the preceding vehicle, and can perform automatic brake control (including following stop control), automatic acceleration control (including following start control), and the like. In this way, it is possible to perform cooperative control aiming at, for example, automatic driving that autonomously travels without depending on driver's operation.

For example, the microcomputer 12051 classifies three-dimensional object data related to a three-dimensional object into a two-wheeled vehicle, a regular vehicle, a large vehicle, a pedestrian, and another three-dimensional object such as a telegraph pole on the basis of the distance information obtained from the imaging units 12101 to 12104 and extracts data, and can use the extracted data for automatic avoidance of an obstacle. For example, the microcomputer 12051 identifies an obstacle around the vehicle 12100 as an obstacle that a driver of the vehicle 12100 can see and an obstacle that is difficult to see. Then, the microcomputer 12051 judges a collision risk indicating a risk of collision with each obstacle. When the collision risk is higher than a set value and there is a possibility of collision, the microcomputer 12051 can perform driving assistance for avoiding collision by outputting an alarm to a driver via the audio speaker 12061 or the display unit 12062, or performing forced deceleration or avoiding steering via the drive system control unit 12010.

At least one of the imaging units 12101 to 12104 may be an infrared camera for detecting an infrared ray. For example, the microcomputer 12051 can recognize a pedestrian by determining whether or not a pedestrian exists in imaged images of the imaging units 12101 to 12104. Such recognition of a pedestrian is performed by, for example, a procedure of extracting characteristic points in imaged images of the imaging units 12101 to 12104 as infrared cameras and a procedure of performing pattern matching processing on a series of characteristic points indicating an outline of an object and determining whether or not a pedestrian exists. If the microcomputer 12051 determines that a pedestrian exists in imaged images of the imaging units 12101 to 12104 and recognizes a pedestrian, the audio image output unit 12052 controls the display unit 12062 such that the display unit 12062 superimposes and displays a rectangular contour line for emphasis on the recognized pedestrian. In addition, the audio image output unit 12052 may control the display unit 12062 such that the display unit 12062 displays an icon or the like indicating a pedestrian at a desired position.

An example of the vehicle control system to which the technology according to the present disclosure can be applied has been described above. The technology according to the present disclosure can be applied to the imaging unit 12031 in the above-described configurations. By applying the technology pertaining to the above-described solid-state imaging elements 100 to 300 to the imaging unit 12031, it is possible to achieve reduction in size and height of the entire apparatus.

(6) Sixth Embodiment

The technology according to the present disclosure (the present technology) can be applied to various products. For example, the technology according to the present disclosure may be applied to an endoscopic surgical system.

Figure 12:
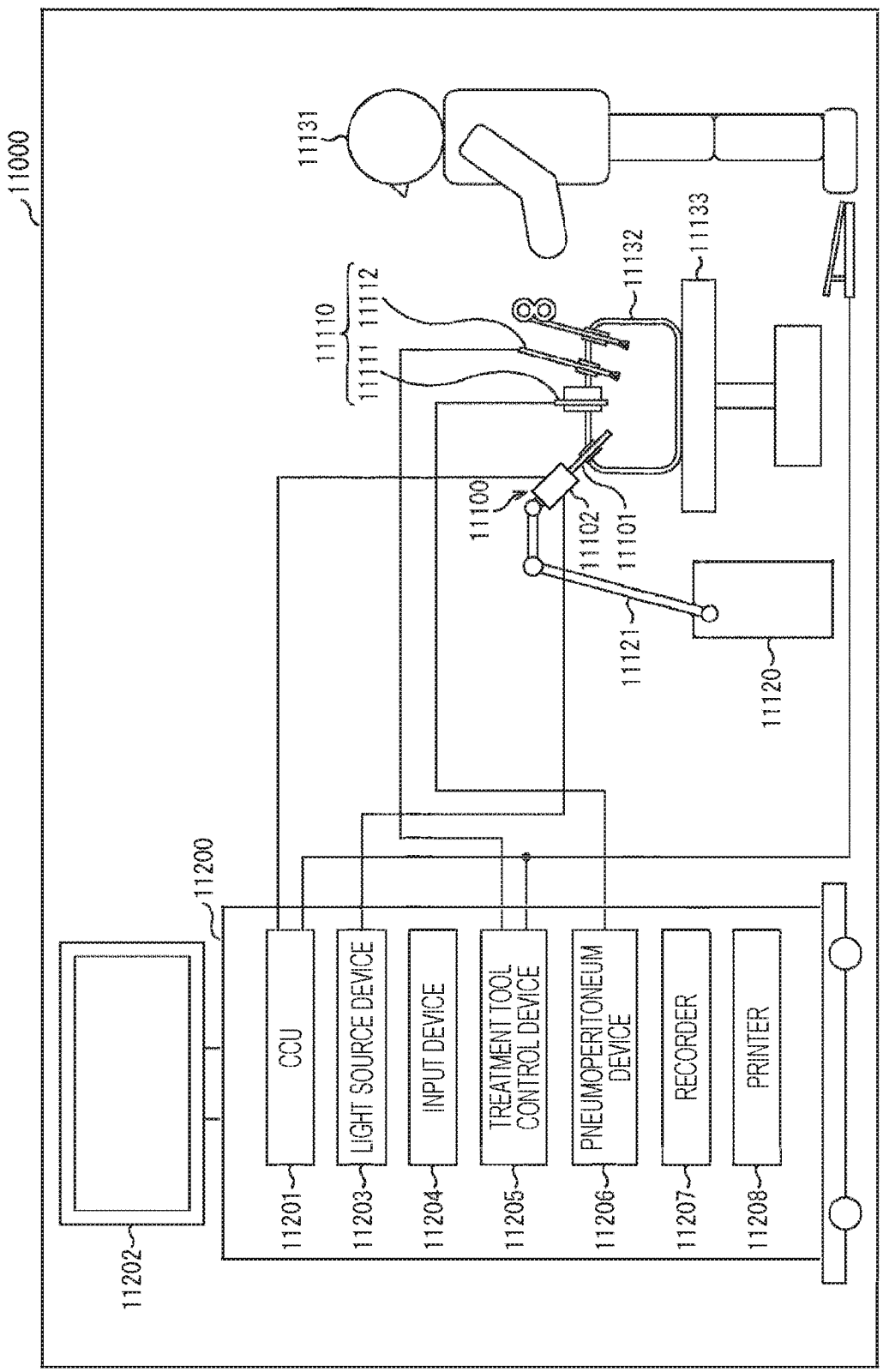
FIG. 12 is a diagram illustrating an example of a schematic configuration of an endoscopic surgical system.

FIG. 12 is a diagram illustrating an example of a schematic configuration of an endoscopic surgical system to which the technology according to the present disclosure (the present technology) can be applied.

FIG. 12 illustrates a situation in which a surgeon (physician) 11131 is performing surgery on a patient 11132 on a patient bed 11133 using an endoscopic surgical system 11000. As illustrated in the drawing, the endoscopic surgical system 11000 includes an endoscope 11100, another surgical tool 11110 such as a pneumoperitoneum tube 11111 or an energy treatment tool 11112, a support arm device 11120 for supporting the endoscope 11100, and a cart 11200 on which various devices for endoscopic surgery are mounted.

The endoscope 11100 includes a lens barrel 11101 to be inserted into a body cavity of the patient 11132 in a region of a predetermined length from a tip thereof, and a camera head 11102 connected to a proximal end of the lens barrel 11101. In the illustrated example, the endoscope 11100 configured as a so-called rigid mirror including the rigid lens barrel 11101 is illustrated, but the endoscope 11100 may be configured as a so-called flexible mirror including a flexible lens barrel.

At the tip of the lens barrel 11101, an opening into which an objective lens is fitted is disposed. A light source device 11203 is connected to the endoscope 11100. Light generated by the light source device 11203 is guided to the tip of the lens barrel by a light guide extended inside the lens barrel 11101, and is emitted toward an observation target in a body cavity of the patient 11132 via the objective lens. Note that the endoscope 11100 may be a direct view mirror, a perspective view mirror, or a side view mirror.

An optical system and an imaging element are disposed inside the camera head 11102. Reflected light (observation light) from an observation target is converged on the imaging element by the optical system. The observation light is photoelectrically converted by the imaging element, and an electric signal corresponding to the observation light, that is, an image signal corresponding to an observation image is generated. The image signal is transmitted as RAW data to a camera control unit (CCU) 11201.

The CCU 11201 includes a central processing unit (CPU), a graphics processing unit (GPU), and the like, and integrally controls operations of the endoscope 11100 and the display device 11202. Furthermore, the CCU 11201 receives an image signal from the camera head 11102, and performs, on the image signal, various image processing for displaying an image based on the image signal, such as development processing (demosaic processing), for example.

The display device 11202 displays an image based on an image signal subjected to image processing by the CCU 11201 under the control of the CCU 11201.

The light source device 11203 includes a light source such as a light emitting diode (LED), for example, and supplies irradiation light for imaging a surgical site or the like to the endoscope 11100.

An input device 11204 is an input interface to the endoscopic surgical system 11000. A user can input various kinds of information and instructions to the endoscopic surgical system 11000 via the input device 11204. For example, the user inputs an instruction or the like to change imaging conditions (type of irradiation light, magnification, focal length, and the like) by the endoscope 11100.

A treatment tool control device 11205 controls driving of the energy treatment tool 11112 for cauterizing and cutting a tissue, sealing a blood vessel, or the like. A pneumoperitoneum device 11206 feeds a gas into a body cavity via the pneumoperitoneum tube 11111 in order to inflate the body cavity of the patient 11132 for the purpose of securing a field of view by the endoscope 11100 and securing a working space of a surgeon. A recorder 11207 is a device capable of recording various kinds of information regarding surgery. A printer 11208 is a device capable of printing various kinds of information regarding surgery in various formats such as a text, an image, and a graph.

Note that the light source device 11203 for supplying irradiation light used for imaging a surgical site to the endoscope 11100 may include an LED, a laser light source, or a white light source constituted by a combination thereof, for example. In a case where the white light source is constituted by a combination of RGB laser light sources, the output intensity and the output timing of each color (each wavelength) can be controlled with high precision, and therefore adjustment of a white balance of an imaged image can be performed by the light source device 11203. In addition, in this case, by irradiating an observation target with laser light from each of the RGB laser light sources in a time division manner and controlling driving of an imaging element of the camera head 11102 in synchronization with the irradiation timing, it is also possible to image an image corresponding to each of RGB in a time division manner. According to this method, a color image can be obtained without disposing a color filter in the imaging element.

In addition, driving of the light source device 11203 may be controlled so as to change the intensity of light output at predetermined time intervals. By controlling driving of the imaging element of the camera head 11102 in synchronization with the timing of the change of the intensity of the light to acquire an image in a time division manner and synthesizing the image, a high dynamic range image without so-called blocked up shadows or blown out highlights can be generated.

In addition, the light source device 11203 may be configured so as to be able to supply light in a predetermined wavelength band corresponding to special light observation. In the special light observation, for example, by irradiation with light in a narrower band than irradiation light (that is, white light) at the time of ordinary observation using wavelength dependency of light absorption in a body tissue, a predetermined tissue such as a blood vessel of a mucosal surface layer is imaged at a high contrast, that is, so-called narrow band imaging is performed. Alternatively, in the special light observation, fluorescence observation for obtaining an image by fluorescence generated by irradiation with excitation light may be performed. In the fluorescence observation, it is possible to observe fluorescence from a body tissue (autofluorescence observation) by irradiating the body tissue with excitation light, or to obtain a fluorescent image by injecting a reagent such as indocyanine green (ICG) into a body tissue and irradiating the body tissue with excitation light corresponding to a fluorescence wavelength of the reagent, for example. The light source device 11203 can be configured so as to be able to supply narrow band light and/or excitation light corresponding to such special light observation.

Figure 13:
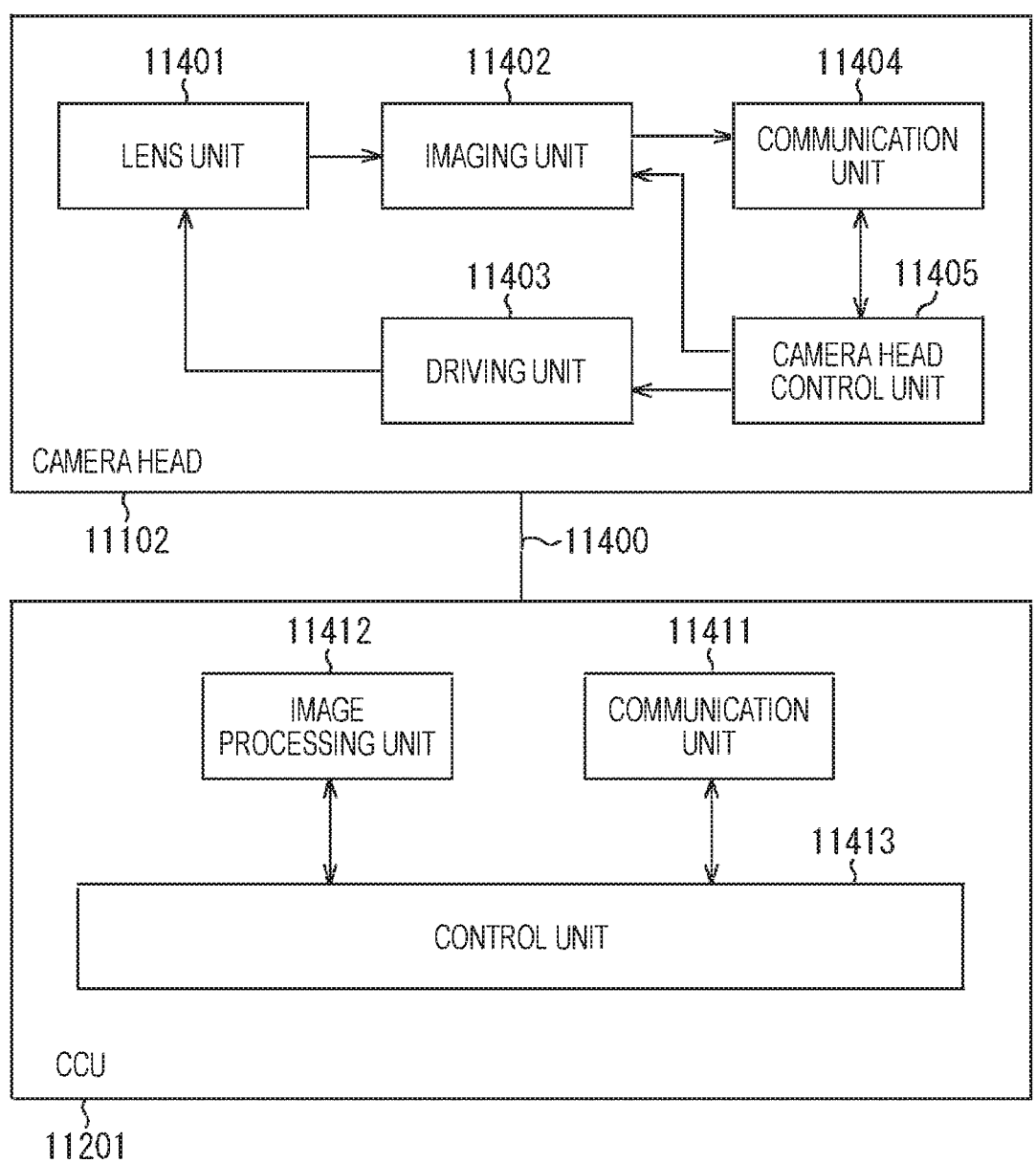
FIG. 13 is a block diagram illustrating examples of functional configurations of a camera head and a CCU.

FIG. 13 is a block diagram illustrating examples of functional configurations of the camera head 11102 and the CCU 11201 illustrated in FIG. 12.

The camera head 11102 includes a lens unit 11401, an imaging unit 11402, a driving unit 11403, a communication unit 11404, and a camera head control unit 11405. The CCU 11201 includes a communication unit 11411, an image processing unit 11412, and a control unit 11413. The camera head 11102 and the CCU 11201 are communicably connected to each other by a transmission cable 11400.

The lens unit 11401 is an optical system disposed at a connecting portion with the lens barrel 11101. Observation light taken in from a tip of the lens barrel 11101 is guided to the camera head 11102 and is incident on the lens unit 11401. The lens unit 11401 includes a combination of a plurality of lenses including a zoom lens and a focus lens.

The imaging unit 11402 includes an imaging element. The imaging unit 11402 may include one imaging element (so-called single plate type) or a plurality of imaging elements (so-called multiplate type). In a case where the imaging unit 11402 includes multiplate type imaging elements, for example, an image signal corresponding to each of RGB may be generated by each imaging element, and a color image may be obtained by synthesizing these image signals. Alternatively, the imaging unit 11402 may include a pair of imaging elements for acquiring an image signal for each of the right eye and the left eye corresponding to three-dimensional (3D) display. By performing the 3D display, the surgeon 11131 can grasp the depth of a living tissue in a surgical site more accurately. Incidentally, in a case where the imaging unit 11402 includes multiplate type imaging elements, a plurality of lens units 11401 can be disposed corresponding to the respective imaging elements.

In addition, the imaging unit 11402 is not necessarily disposed in the camera head 11102. For example, the imaging unit 11402 may be disposed just behind an objective lens inside the lens barrel 11101.

The driving unit 11403 includes an actuator, and moves a zoom lens and a focus lens of the lens unit 11401 by a predetermined distance along an optical axis under control of the camera head control unit 11405. As a result, the magnification and the focus of an image imaged by the imaging unit 11402 can be appropriately adjusted.

The communication unit 11404 includes a communication device for transmitting and receiving various kinds of information to and from the CCU 11201. The communication unit 11404 transmits an image signal obtained from the imaging unit 11402 as RAW data to the CCU 11201 via the transmission cable 11400.

In addition, the communication unit 11404 receives a control signal for controlling driving of the camera head 11102 from the CCU 11201, and supplies the control signal to the camera head control unit 11405. The control signal includes information regarding imaging conditions such as information indicating designation of a frame rate of an imaged image, information indicating designation of an exposure value at the time of imaging, and/or information indicating designation of the magnification and the focus of an imaged image, for example.

Note that the imaging conditions such as the frame rate, the exposure value, the magnification, and the focus may be appropriately designated by a user, or may be automatically set by the control unit 11413 of the CCU 11201 on the basis of an acquired image signal. In the latter case, the endoscope 11100 has a so-called auto exposure (AE) function, a so-called auto focus (AF) function, and a so-called auto white balance (AWB) function.

The camera head control unit 11405 controls driving of the camera head 11102 on the basis of a control signal from the CCU 11201 received via the communication unit 11404.

The communication unit 11411 includes a communication device for transmitting and receiving various kinds of information to and from the camera head 11102. The communication unit 11411 receives an image signal transmitted from the camera head 11102 via the transmission cable 11400.

In addition, the communication unit 11411 transmits a control signal for controlling driving of the camera head 11102 to the camera head 11102. The image signal and the control signal can be transmitted by electric communication, optical communication, or the like.

The image processing unit 11412 performs various kinds of image processing on the image signal which is RAW data transmitted from the camera head 11102.

The control unit 11413 performs various kinds of control concerning imaging of a surgical site or the like by the endoscope 11100 and display of an imaged image obtained by imaging a surgical site or the like. For example, the control unit 11413 generates a control signal for controlling driving of the camera head 11102.

In addition, the control unit 11413 causes the display device 11202 to display an imaged image of a surgical site or the like on the basis of an image signal subjected to image processing by the image processing unit 11412. In this case, the control unit 11413 may recognize various objects in the imaged image using various image recognition techniques. For example, by detecting the shape, color, and the like of an edge of an object included in the imaged image, the control unit 11413 can recognize a surgical tool such as forceps, a specific living body part, bleeding, a mist at the time of using the energy treatment tool 11112, and the like. When the display device 11202 displays the imaged image, the control unit 11413 may cause the display device 11202 to superimpose and display various kinds of surgical support information on the image of the surgical site using the recognition result. The surgical support information is superimposed and displayed, and presented to the surgeon 11131. This makes it possible to reduce a burden on the surgeon 11131 and makes it possible for the surgeon 11131 to reliably perform surgery.

The transmission cable 11400 connecting the camera head 11102 to the CCU 11201 is an electric signal cable corresponding to communication of an electric signal, an optical fiber corresponding to optical communication, or a composite cable thereof.

Here, in the illustrated example, communication is performed by wire using the transmission cable 11400, but communication between the camera head 11102 and the CCU 11201 may be performed wirelessly.

An example of the endoscopic surgical system to which the technology according to the present disclosure can be applied has been described above. The technology according to the present disclosure can be applied to the imaging unit 11402 of the camera head 11102 among the above-described configurations.

By applying the technology pertaining to the above-described solid-state imaging elements 100 to 300 to the imaging unit 11402, it is possible to achieve reduction in size and height of the entire apparatus.

Note that the endoscopic surgical system has been described as an example here. However, the technology according to the present disclosure may also be applied to, for example, a microscopic surgery system and the like.

(7) Seventh Embodiment

The technology according to the present disclosure (the present technology) can be applied to various products. For example, the technology according to the present disclosure may be applied to an endoscopic surgical system.

Figure 14:
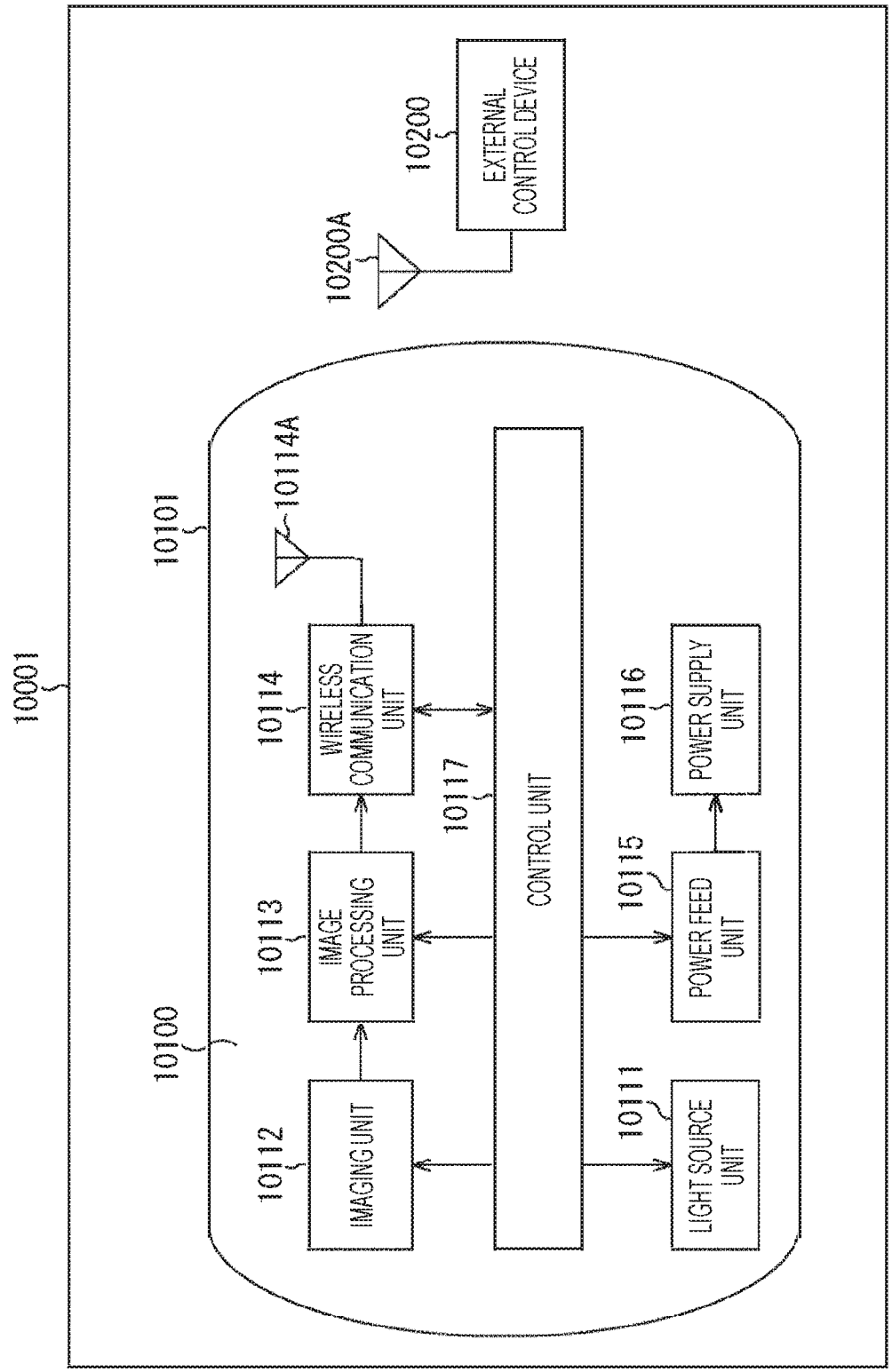
FIG. 14 is a block diagram illustrating an example of a schematic configuration of an in-vivo information acquiring system.

FIG. 14 is a block diagram illustrating an example of a schematic configuration of a patient in-vivo information acquiring system using a capsule type endoscope to which the technology according to the present disclosure (the present technology) can be applied.

An in-vivo information acquiring system 10001 includes a capsule type endoscope 10100 and an external control device 10200.

The capsule type endoscope 10100 is swallowed by a patient at the time of examination. The capsule type endoscope 10100 has an imaging function and a wireless communication function. While moving inside an organ such as the stomach or the intestine by peristaltic movement or the like before natural discharge from a patient, the capsule type endoscope 10100 sequentially images an image of an inside of the organ (hereinafter also referred to as an in-vivo image) at predetermined intervals, and sequentially wirelessly transmits information regarding the in-vivo image to the external control device 10200 outside the body.

The external control device 10200 integrally controls an operation of the in-vivo information acquiring system 10001. In addition, the external control device 10200 receives information regarding the in-vivo image transmitted from the capsule type endoscope 10100, and generates image data for displaying the in-vivo image on a display device (not illustrated) on the basis of the received information regarding the in-vivo image.

In this way, the in-vivo information acquiring system 10001 can obtain an in-vivo image obtained by imaging the state of an inside of a patient body at any time during a period between swallow of the capsule type endoscope 10100 and discharge thereof.

The configurations and functions of the capsule type endoscope 10100 and the external control device 10200 will be described in more detail.

The capsule type endoscope 10100 includes a capsule type casing 10101, and the casing 10101 houses a light source unit 10111, an imaging unit 10112, an image processing unit 10113, a wireless communication unit 10114, a power feed unit 10115, a power supply unit 10116, and a control unit 10117.

The light source unit 10111 includes a light source such as a light emitting diode (LED), for example, and irradiates an imaging field of view of the imaging unit 10112 with light.

The imaging unit 10112 includes an imaging element and an optical system including a plurality of lenses disposed in a preceding stage of the imaging element. Reflected light (hereinafter referred to as observation light) of light with which a body tissue as an observation target has been irradiated is collected by the optical system and is incident on the imaging element. In the imaging unit 10112, the imaging element photoelectrically converts observation light incident thereon, and an image signal corresponding to the observation light is generated. The image signal generated by the imaging unit 10112 is provided to the image processing unit 10113.

The image processing unit 10113 includes a processor such as a central processing unit (CPU) or a graphics processing unit (GPU), and performs various signal processing on the image signal generated by the imaging unit 10112. The image processing unit 10113 provides the image signal subjected to the signal processing as RAW data to the wireless communication unit 10114.

The wireless communication unit 10114 performs predetermined processing such as modulation processing on the image signal subjected to signal processing by the image processing unit 10113 and transmits the image signal to the external control device 10200 via an antenna 10114A. In addition, the wireless communication unit 10114 receives a control signal concerning driving control of the capsule type endoscope 10100 from the external control device 10200 via the antenna 10114A. The wireless communication unit 10114 provides the control signal received from the external control device 10200 to the control unit 10117.

The power feed unit 10115 includes an antenna coil for power reception, a power regeneration circuit for regenerating power from a current generated in the antenna coil, a booster circuit, and the like. The power feed unit 10115 generates power using the principle of so-called non-contact charging.

The power supply unit 10116 includes a secondary battery, and stores power generated by the power feed unit 10115. In FIG. 14, in order to avoid complication of the drawing, illustration of an arrow or the like indicating the destination of power supply from the power supply unit 10116 is omitted. However, the power stored in the power supply unit 10116 is supplied to the light source unit 10111, the imaging unit 10112, the image processing unit 10113, the wireless communication unit 10114, and the control unit 10117, and can be used for driving of these units.

The control unit 10117 includes a processor such as a CPU, and appropriately controls driving of the light source unit 10111, the imaging unit 10112, the image processing unit 10113, the wireless communication unit 10114, and the power feed unit 10115 according to a control signal transmitted from the external control device 10200.

The external control device 10200 includes a processor such as a CPU or a GPU, or a microcomputer, a control board, or the like on which a processor and a storage element such as a memory are mixedly mounted. The external control device 10200 controls an operation of the capsule type endoscope 10100 by transmitting a control signal to the control unit 10117 of the capsule type endoscope 10100 via an antenna 10200A. In the capsule type endoscope 10100, for example, light irradiation conditions with respect to an observation target in the light source unit 10111 can be changed by a control signal from the external control device 10200. In addition, imaging conditions (for example, a frame rate in the imaging unit 10112, an exposure value, or the like) can be changed by the control signal from the external control device 10200. In addition, depending on the control signal from the external control device 10200, the contents of the processing in the image processing unit 10113 and conditions under which the wireless communication unit 10114 transmits an image signal (for example, a transmission interval, the number of transmitted images, or the like) may be changed.

In addition, the external control device 10200 performs various image processing on an image signal transmitted from the capsule type endoscope 10100, and generates image data for displaying the imaged in-vivo image on a display device. As the image processing, various signal processing such as development processing (demosaic processing), high image quality processing (band enhancement processing, super-resolution processing, noise reduction (NR) processing, and/or camera shake correction processing, for example), and/or enlargement processing (electronic zoom processing) can be performed, for example. The external control device 10200 controls driving of the display device and causes the display device to display an in-vivo image imaged on the basis of the generated image data. Alternatively, the external control device 10200 may cause a recording device (not illustrated) to record the generated image data, or cause a printing device (not illustrated) to print out the generated image data.

An example of the in-vivo information acquiring system to which the technology according to the present disclosure can be applied has been described above. The technology according to the present disclosure can be applied to the imaging unit 10112 in the above-described configurations. By applying the technology pertaining to the above-described solid-state imaging elements 100 to 300 to the imaging unit 10112, it is possible to achieve reduction in size and height of the entire apparatus.

Note that the present technology is not limited to the above-described embodiments and also includes a configuration in which the configurations disclosed in the above-described embodiments are replaced with each other or combination thereof is changed, a configuration in which related art and the configurations disclosed in the above-described embodiments are replaced with each other or combination thereof is changed, and the like. In addition, the technical scope of the present technology is not limited to the above-described embodiments, but extends to matters described in the claims and equivalents thereof.

In addition, the present technology can have the following configurations.

(1)

A solid-state imaging apparatus including:

a substrate having a recess on a surface thereof;

an imaging chip disposed and fixed on an inner bottom surface of the recess; and a filler filled and solidified in the whole of a gap between a side surface of the imaging chip and an inner surface of the recess, in which a groove having a substantially constant width is formed between the side surface of the imaging chip and the inner surface of the recess, and an expansion portion where the groove width is equal to or larger than the constant width is formed in a part of the groove.

(2)

The solid-state imaging apparatus according to (1), in which the recess and the imaging chip are substantially rectangular, and the expansion portion is formed at a portion corresponding to a corner of each of the recess of the groove and the imaging chip.

(3)

The solid-state imaging apparatus according to (2), in which the expansion portion is formed in a size capable of inserting a cylindrical member having a diameter larger than the size of a cylindrical member that can be inserted into a corner in a case where the groove is formed substantially constantly.

(4)

The solid-state imaging apparatus according to (1), in which the recess and the imaging chip are substantially rectangular, and the expansion portion is formed at a portion corresponding to a side of each of the recess of the groove and the imaging chip.

(5)

The solid-state imaging apparatus according to (4), in which the expansion portion is formed in a size capable of inserting a cylindrical member having a diameter larger than the groove width in a case where the groove is formed substantially constantly.

(6)

The solid-state imaging apparatus according to any one of (1) to (5), in which the expansion portion is formed in a plurality of locations of the groove, and the plurality of expansion portions is formed in a point symmetric positional relationship with the center of the recess or the imaging chip as a target axis.

(7)

The solid-state imaging apparatus according to any one of (1) to (6), in which wiring formed on an upper surface outside a recess of the substrate is connected to a terminal formed on an upper surface of the imaging chip by bridge metal wiring formed in a thin film across a filler filled in the groove, and an upper surface side of the bridge metal wiring is covered with a light shielding film.

(8)

The solid-state imaging apparatus according to (7), in which a plurality of the bridge metal wiring is juxtaposed in a direction in which the groove extends, and the light shielding film is disposed so as to cover the plurality of bridge metal wiring including the whole of the groove.

(9)

The solid-state imaging apparatus according to any one of (1) to (8), in which the filler includes a filler material, and a relationship of $x_1 < x_2 < x_3$ is satisfied between the size $x_1$ of the filler material, the width $x_2$ of the groove having a substantially constant width other than the expansion portion, and the size $x_3$ of the expansion portion.

(10)

A method for manufacturing a solid-state imaging apparatus, including:

a step of disposing and fixing an imaging chip on an inner bottom surface of a substrate having a recess on a surface thereof; and a step of filling and solidifying a filler in the whole of a gap between a side surface of the imaging chip and an inner surface of the recess, in which a groove having a substantially constant width is formed between the side surface of the imaging chip and the inner surface of the recess, and an expansion portion where the groove width is equal to or larger than the substantially constant width is formed in a part of the groove.

REFERENCE SIGNS LIST

10 Substrate
11 On-substrate wiring
12 Recess
13 Peripheral wall
14 Groove
20 Imaging chip
21 Bottom surface
22 Outer surface
23 Upper surface
24 Terminal
30 Adhesive
40 Filler
50 Bridge metal wiring
60 Light shielding film
70 Transparent insulating film
100 Solid-state imaging apparatus
121 Inner bottom surface
122 Inner surface
123 Chip mounting area
124 Filler area
125 Corner
126 Side
127 Lead-in portion
128 Expansion portion
131 Peripheral wall upper surface
231 Light incident area
232 Non-light incident area

The invention claimed is:

1. A solid-state imaging apparatus, comprising:
a substrate having a recess on a surface thereof;
an imaging chip disposed and fixed on an inner bottom surface of the recess; and
a filler filled and solidified in whole of a gap between a side surface of the imaging chip and an inner surface of the recess, wherein
a groove having a substantially constant width is between the side surface of the imaging chip and the inner surface of the recess, and
an expansion portion is in a part of the groove, and
a width of the expansion portion is equal to or larger than the substantially constant width of the groove.

2. The solid-state imaging apparatus according to claim 1, wherein
the recess and the imaging chip are substantially rectangular, and
the expansion portion is in the groove at a portion corresponding to a corner of each of the recess and the imaging chip.

3. The solid-state imaging apparatus according to claim 2, wherein the expansion portion is of a size capable of insertion of a first cylindrical member having a diameter larger than a size of a second cylindrical member for insertion into the corner in a case where the groove is of the substantially constant width.

4. The solid-state imaging apparatus according to claim 1, wherein
the recess and the imaging chip are substantially rectangular, and
the expansion portion is in the groove corresponding to a side of each of the recess and the imaging chip.

5. The solid-state imaging apparatus according to claim 4, wherein the expansion portion is of a size capable of insertion of a cylindrical member having a diameter larger than the substantially constant width of the groove.

6. The solid-state imaging apparatus according to claim 1, wherein
a plurality of expansion portions is in a plurality of locations of the groove, and
the plurality of expansion portions is in points having symmetric positional relationship with a center of the recess or a center of the imaging chip as a target axis.

7. The solid-state imaging apparatus according to claim 1, wherein
wiring on an upper surface outside the recess of the substrate is connected to a terminal on an upper surface of the imaging chip via a bridge metal wiring in a thin film across the filler filled in the groove, and
an upper surface side of the bridge metal wiring is covered with a light shielding film.

8. The solid-state imaging apparatus according to claim 7, wherein
a plurality of bridge metal wirings is juxtaposed in a direction in which the groove extends, and
the light shielding film covers the plurality of bridge metal wirings and whole of the groove.

9. The solid-state imaging apparatus according to claim 1, wherein
the filler includes a filler material,
a relationship of $x_1 < x_2 < x_3$ is satisfied, and
$x_1$ is a size of the filler material, $x_2$ is a width of the groove having the substantially constant width, and $x_3$ is a size of the expansion portion.

10. A method for manufacturing a solid-state imaging apparatus, comprising:
disposing and fixing an imaging chip on an inner bottom surface of a substrate having a recess on a surface thereof; and
filling and solidifying a filler in whole of a gap between a side surface of the imaging chip and an inner surface of the recess, wherein
a groove having a substantially constant width is between the side surface of the imaging chip and the inner surface of the recess, and
an expansion portion is in a part of the groove, and
a width of the expansion portion is equal to or larger than the substantially constant width of the groove.

* * * * *